United States Patent
Romaniuk

(10) Patent No.: US 7,085,029 B2
(45) Date of Patent: Aug. 1, 2006

(54) DYNAMIC PHASE LOGIC GATE

(76) Inventor: Charles Romaniuk, #539 321 Walnut St., Newtonville, MA (US) 02460-1927

(*) Notice: Subject to any disclaimer, the term of this patent is extended or adjusted under 35 U.S.C. 154(b) by 35 days.

(21) Appl. No.: 10/351,595

(22) Filed: Jan. 27, 2003

(65) Prior Publication Data

US 2003/0179425 A1    Sep. 25, 2003

Related U.S. Application Data

(63) Continuation of application No. 09/522,912, filed on Mar. 10, 2000, now abandoned.

(51) Int. Cl.
G06E 1/00    (2006.01)

(52) U.S. Cl. .................. 359/108; 359/107
(58) Field of Classification Search ............ 359/107, 359/108

See application file for complete search history.

(56) References Cited

U.S. PATENT DOCUMENTS

| | | | |
|---|---|---|---|
| 4,262,992 A | 4/1981 | Berthold, III | |
| 4,729,111 A | 3/1988 | Arrathoon et al. | |
| 4,811,258 A | 3/1989 | Andersen et al. | |
| 4,932,739 A | 6/1990 | Islam | |
| 4,978,842 A | 12/1990 | Hinton et al. | |
| 5,020,050 A | 5/1991 | Islam | |
| 5,044,726 A | 9/1991 | Grego | |
| 5,078,464 A | 1/1992 | Islam | |
| 5,093,802 A | 3/1992 | Hait | |
| 5,134,668 A | 7/1992 | Appel | |
| 5,150,248 A | 9/1992 | Alfano et al. | |
| 5,155,619 A | 10/1992 | Fellows | |
| 5,283,844 A | 2/1994 | Rice et al. | |
| H1296 H | 4/1994 | Simmons et al. | |
| 5,315,573 A | 5/1994 | Nakao et al. | |
| 5,414,789 A | 5/1995 | Tamil | |
| 5,463,485 A | 10/1995 | Alfano et al. | |
| 5,524,014 A | 6/1996 | Kaminow et al. | |
| 5,526,449 A | 6/1996 | Meade et al. | |
| 5,535,001 A | 7/1996 | Tajima | |
| 5,539,668 A | 7/1996 | Tokuda et al. | |

(Continued)

FOREIGN PATENT DOCUMENTS

EP    0468669 A1    1/1992

(Continued)

OTHER PUBLICATIONS

Annalisa Lattes, et al., "An Ultrafast All-Optical Gate", IEEE J. Quantum Elec. vol. QE-19, No. 11, pp. 1718-1723, Nov. 1983.*

(Continued)

Primary Examiner—Fayez G. Assaf
(74) Attorney, Agent, or Firm—Ralph A. Dowell; Dowell & Dowell, P.C.

(57) ABSTRACT

A logic device for use with data signals having a continuously or semi-continuously varying waveform of substantially fixed frequency. The device provides a logical output from at least one of the data inputs and comprising a first pair of inputs each to receive a data signal having one of a predetermined set of values representing analog, discrete, or digital states. A combiner stage is used to combine the inputs and produce a signal therefrom. A filter stage is utilized to receive the signal and produce a conditioned signal representative of one of a pair of binary states. The conditioned signal is combined with a second control input. The resultant signal is passed to an output.

60 Claims, 16 Drawing Sheets

U.S. PATENT DOCUMENTS

| | | | |
|---|---|---|---|
| 5,555,126 | A | 9/1996 | Hait |
| 5,644,123 | A | 7/1997 | Hait |
| 5,706,377 | A | 1/1998 | Li |
| 5,724,462 | A | 3/1998 | Ido et al. |
| 5,740,117 | A | 4/1998 | Bona et al. |
| 5,757,995 | A | 5/1998 | Chen et al. |
| 5,799,119 | A | 8/1998 | Rolland et al. |
| 5,838,844 | A | 11/1998 | Van Dam et al. |
| 5,894,491 | A | 4/1999 | Sawano et al. |
| 5,999,283 | A | 12/1999 | Roberts et al. |
| 5,999,284 | A | 12/1999 | Roberts |
| 6,035,079 | A | 3/2000 | Fields et al. |
| 6,091,536 | A | 7/2000 | Usami et al. |
| 6,128,110 | A | 10/2000 | Bulow |

FOREIGN PATENT DOCUMENTS

| | | |
|---|---|---|
| JP | 06-214280 | 5/1994 |

OTHER PUBLICATIONS

Bopp, M. et al., "BPSK Homodyne and DPSK Heterodyne Receivers for Free-Space Communication with Nd: Host Lasers", ANT Nachrichtentechnik GmbH: Space Communications Systems Division, SPIE vol. 1522, Optical Space Communication II, 1991, pp. 199-209.

"BBV: Software for Integrated Optics", BBC Software BV, 1998 7 pages.

Craig, R.G. et al., "All-Optical Programmable Logic Gate", Applied Optics, vol. 29, No. 14, May 10, 1990, pp. 2148-2152.

Haus, H.A. et al., "All Optical Logic Devices Using Group III-V Semiconductor Waveguides" Department of Electrical Engineering and Computer Science and Research Laboratory of Electronics, SPIE vol. 578, Integrated Optical Circuit Engineering II, 1985, pp. 122-129.

Kitayama et al., "Fiber-Optic Logic Gate", Applied Physics Letters 46, No. 4, New York, U.S.A., pp. 317-319, Feb. 15, 1985, XP-02187476.

Mecherle, G. Stephen, "Direct Phase Modulation of Laser Diodes", TRW Inc., SPIE vol. 635, Free-Space Laser Communication Technologies IV, 1992, pp. 63-73.

Mecherle, G. Stephen and Henderson, Rober J., "Homodyne PSK Receivers with Laser Diode Sources", TRW Electronic Systems Group, SPIE vol. 1417, Free-Space Laser Communication Technologies III, 1999, pp. 99-107.

Mentzer, Mark A., "Principles of Optical Circuit Engineering: Chapter 10— Devices and Systems Applications", Marcel Dekker Inc., 1990, pp. 228-231.

Morris, Mano M., "Digital Design: (2nd Ed.) Chapter 1: Binary Systems; 1.1 Binary Logic", Prentice-Hall Inc., 1991, pp. 28-29.

Rudokas, R.S. and Guilfoyle, P.S., "A Digital Optical Implementation of RISC", OptiComp Corporation, Zephyr Cove, NV, 1991.

Spector, Andrew, "Silica Optical Waveguide Device", Photonic Integration Research Inc., Columbus, OH, Oct. 1, 1996.

Stremler, Ferrel G., "Introduction to Communication Systems: (3rd Ed.) Digital Modulation-Phase-Shift Keying (PSK)", Addison-Wesley Publishing Company Inc., 1990, pp. 618-625.

Umbach, A. et al., "27 GHz Bandwidth Integrated Photreceiver Comprising a Waveguide Fed Photodiode and a GaInAs/AlInAs-HEMT based Travelling Wave Amplifier", Heinrich-Hertz-Institut, Berlin, Germany, 1996.

"Waveguide Bends in Photonic Crystals", The Joannopoulos Research Group at MIT, Feb. 19, 1999.

Yamamoto et al., "High Output Power Characteristics in Broad-Channeled Substrate Inner Stripe Lasers", Applied Physics Letters 46, No. 4, New York, U.S.A., p. 319, Feb. 15, 1985, XP-002187476. one page.

* cited by examiner (a)

(b)

(c)

US 7,085,029 B2

DYNAMIC PHASE LOGIC GATE (This is a continuation of U.S. patent application Ser. No. 09/522,912, filed on Mar. 10, 2000 now abandoned)

The present invention relates to logic devices.

BACKGROUND OF THE INVENTION

The use of semiconductors to perform logical functions, such as AND, OR or arithmetic functions, is well known in the art. Such semiconductors come in a wide range of sizes, including small scale integrated circuits having 2 to 4 logic gates per package and very large scale integrated circuits, such as microprocessors.

Semiconductor devices do have their shortcomings. Electronic devices are limited in operational speeds because of their inherent electrical resistance and capacitance. A further disadvantage of semiconductor devices is electronic crosstalk, since electronic signals are highly susceptible to interference. Since electrons have electromagnetic fields that can easily interact, two adjacent electronic signals will affect one another, even if they are a significant distance apart.

The next generation of logic devices is electromagnetic phase devices. These phase devices operate on electromagnetic signals without the aid of electronic control, so that the phase devices are capable of operating at speeds comparable to the speed of light. Another advantage of the phase devices is that they can be manufactured from simple small integrated devices, such as waveform couplers, splitters, and other devices made on a micron scale.

A wide range of electromagnetic phase devices have been developed to take advantage of increased processing speed and reduced interference between adjacent signals. One disadvantage of the current electromagnetic phase devices is that the output of a first device cannot be directly cascaded to a similar device, since the format of the output is not suitable as an input for the second device. Accordingly, most of the current phase devices also have either a specific or limited functionality and operation of the devices is usually limited to a particular logical or arithmetic function.

It is an object of the present invention to provide a logic device to obviate or mitigate some of the above mentioned disadvantages.

SUMMARY OF THE INVENTION

According to the present invention there is provided a logic device for use with input signals having a periodic waveform of substantially fixed frequency. The device provides a logical output from the input signals and comprises at least two inputs each for receiving a data signal having one of a predetermined set of values. A combiner stage is employed for combining the data signals and producing an intermediate signal therefrom. The intermediate signal has one of a set of intermediate states. A filter stage for receiving the intermediate signal and mapping the intermediate signal to a corresponding one of a set of condition states to produce a condition signal. An output stage is employed for passing the condition signal to an output.

A further aspect of the present invention provides a method for providing a logical output signal for use with input signals having a periodic waveform of substantially fixed frequency including the steps of:

a) receiving a plurality of data signals as inputs, each of the data signals having one of a predetermined set of values;

b) combining the plurality of data signals for producing an intermediate signal therefrom, the intermediate signal having one of a set of intermediate states;

c) mapping the intermediate signal to a corresponding one of a set of conditioned states to produce a condition signal; and d) passing the condition signal to an output.

Another aspect to the present invention provides a logic device for use with data signals comprising optical beams of substantially fixed frequency. The device produces a logical output from at least one of the data inputs. A pair of inputs and a control input each receive a data signal having one of a predetermined set of values. Coupler stage is employed to combine the inputs for producing an intermediate signal therefrom. The intermediate signal has one of a set of intermediate states. A filter stage is used to receive the intermediate signal and map the intermediate signal to one of a pair of binary states. An output stage passes the condition signal to an output.

BRIEF DESCRIPTION OF THE DRAWINGS

An embodiment of the invention will now be described by way of example only with reference to the following drawings in which.

DESCRIPTION OF THE PREFERRED EMBODIMENTS

Figure 1:
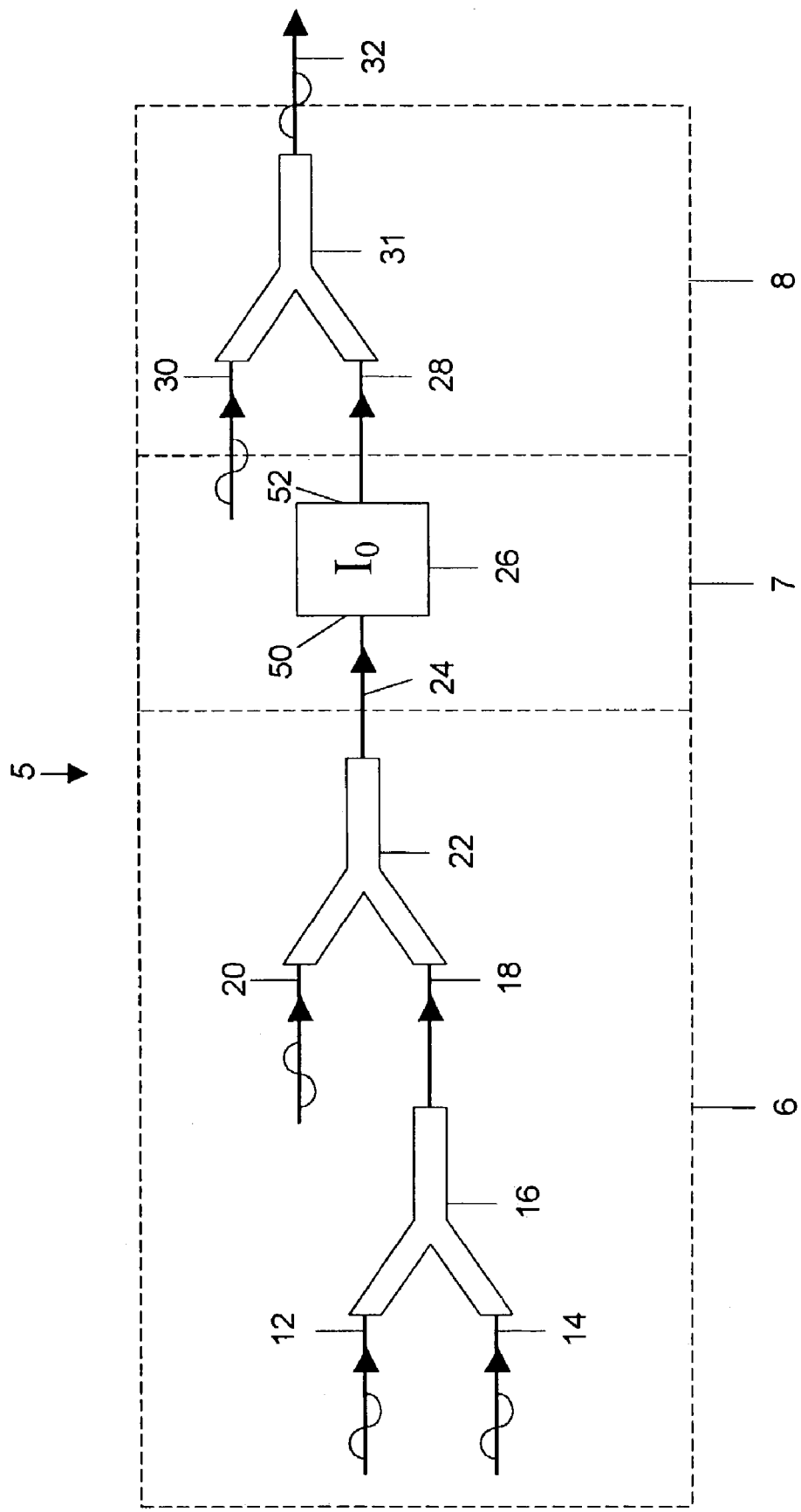
FIG. 1 shows a schematic of a Dynamic Phase Logic Gate.

Referring to FIG. 1, dynamic phase logic gate DPLG 5 includes a first stage 6 for combining a plurality of waveform inputs 12, 14, 20 to produce an intermediate waveform signal 24. Connected to the first stage 6 is a second or filter stage 7, which modifies a wave property of the signal 24 to produce a filtered signal 28. The filter stage 7 is employed to map the analog states of the signal 24 to two binary states represented by the filter signal 28. The filtered signal 28 can then be directed into a third stage 8, which is used to modify the waveform properties of the signal 28 to produce a resultant binary output 32. The output 32 preferably has the same frequency and magnitude as the inputs 12, 14, 20. This facilitates a cascading of several DPLGs 5 in circuits.

AND Gate Example

A variety of functions can be performed by the DPLG 5 based on the waveform properties of the first control input 20, applied in the first stage 6, and a second control input 30, applied in the third stage 8. The following description of the form and operation of the DPLG 5 is illustrated using a two-input AND gate logic function by way of example only. The wave properties of the control inputs 20, 30 are selected so as to program the DPLG 5 to perform a logical AND operation on the data inputs 12, 14 to produce the binary values of the resultant output 32.

Stage 1

Figure 2:
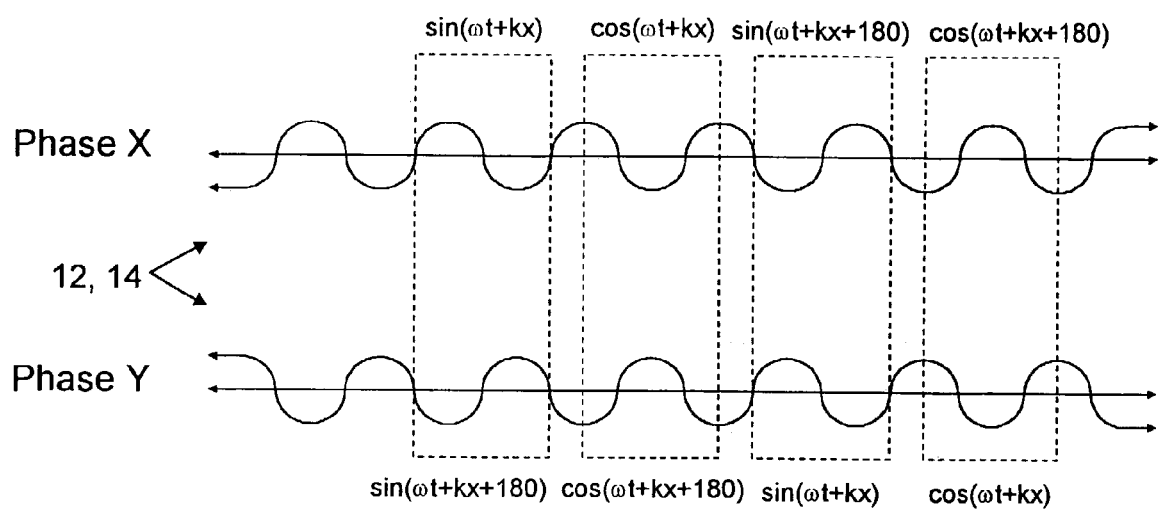
FIG. 2 shows example waveforms of inputs and outputs to the gate of FIG. 1.

In Stage 1, the data inputs 12, 14 of the DPLG 5 are two coherent waveforms of the same frequency and equal amplitude, as shown in FIG. 2, which can be composed of any periodic signal of fixed frequency, such as, but not limited to, laser beams, X-rays, particle beams, and acoustic waves. The propagation characteristics of the waveforms can be connected pulses, connected pulse groups, semi-continuous waveforms (disconnected groups of periodic varying waveforms), or preferably continuous waveforms. The waveform inputs 12, 14 are externally modulated to have only one of two phase values, either equal phase (0° phase shift) or opposite phase (180° phase shift). The two data values of the DPLG 5 can be represented by $X = I \sin(\omega t + kx)$ and $Y = I \sin(\omega t + kx + \pi)$ where the waveform magnitude is an arbitrary relative measure in units of I. For example, 1X represents a waveform of phase X (0° phase shift) with a magnitude equal to 1I. Corresponding digital logic values of the data inputs 12, 14 are represented in this example by the convention 1X=OFF and 1Y=ON, which is based on the Binary Phase Shift Method of electronics. Table shows the four possible combinations of the inputs 12, 14 in this example two-input AND function.

TABLE 1

| Signal | 12 | 14 |
|---|---|---|
| Data Value | 1X | 1X |
| Logic Value | OFF | OFF |
| Data Value | 1X | 1Y |
| Logic Value | OFF | ON |
| Data Value | 1Y | 1X |
| Logic Value | ON | OFF |
| Data Value | 1Y | 1Y |
| Logic Value | ON | ON |

Figure 3:
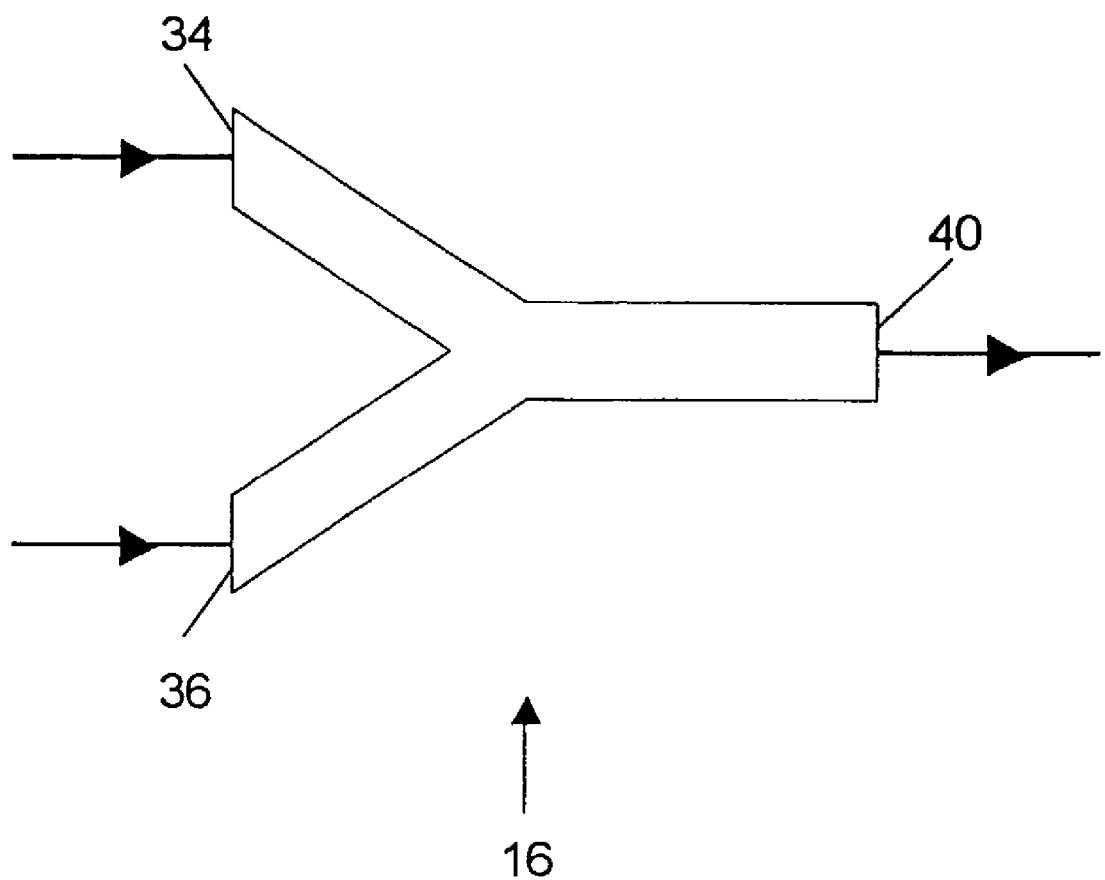
FIG. 3 is a schematic of a waveform combiner of FIG. 1.

In Stage 1, the data inputs 12, 14 are combined by a wave combiner 16 that employs three ports 34, 36, 40, as shown in FIG. 3. The waveform combiner 16 operates using the principle of constructive/destructive interference. Inputs 12, 14 that have equal phases, such as 1X—1X, result in constructive interference and a combined output signal 18 of 2X. Inputs 12, 14 that have opposite phases, such as 1X–1Y, result in destructive interference and the output signal 18 consisting of no transmitted signal. A set of desirable operational characteristics for the waveform combiner 16 are, but are not limited to, the following:

1. only a number of input ports equal to the number of inputs are utilized;
2. only a number of output ports equal to the number of outputs are utilized;
3. the frequency and polarization of the input waveforms are the same;
4. the frequency and polarization of the output waveforms should be the same as the frequency and polarization of the input waveforms;
5. two input waveforms of equal phase and magnitude should result in a single output waveform with the same phase and twice the magnitude of either input waveform;
6. two input waveforms of opposite phase and equal magnitude should result in a single output waveform with negligible magnitude;
7. two input waveforms of equal phases and different magnitudes should combine arithmetically by simple addition to produce a single output waveform with the same phase and a magnitude greater than either input waveform; however, two input waveforms of equal phases and different magnitudes may also combine arithmetically by complex addition, such as by a mathematical function, to produce a single output waveform with the same phase and a magnitude greater than, or less than, either input waveform; and
8. two input waveforms of opposite phases and different magnitudes should combine arithmetically by simple subtraction to produce a single output waveform with a magnitude less than one of the input waveforms and a phase equal to the phase of the waveform with the larger magnitude; however, two input waveforms of opposite phases and different magnitudes may also combine arithmetically by complex subtraction, such as by a mathematical function, to produce a single output waveform with a magnitude greater than, or less than, either input waveform and a phase equal to the phase of the waveform with the larger magnitude.

The output signal 18, resulting from the four possible combinations of the inputs 12, 14 to the waveform combiner 16, is given in Table 2.

TABLE 2

| Signal | 12 | 14 | 18 |
|---|---|---|---|
| Data Value | 1X | 1X | 2X |
| Logic Value | OFF | OFF | |
| Data Value | 1X | 1Y | — |
| Logic Value | OFF | ON | |
| Data Value | 1Y | 1X | — |
| Logic Value | ON | OFF | |
| Data Value | 1Y | 1Y | 2Y |
| Logic Value | ON | ON | |

Also within the first stage 6, the output signal 18 is directed into the input port 36 of a second waveform combiner 22, which has the same construction as the waveform combiner 16 shown in FIG. 3. The first control input 20 is directed into the input port 34 and is subsequently combined with the output signal 18 to produce the intermediate output signal 24. The control input 20 has the same frequency and magnitude as the data inputs 12, 14. The data value of the control input 20, 1Y in this example, depends upon the logic function to be performed by the DPLG 5, as will be explained below. Table 3 shows the intermediate output signal 24 for the various values of the signal 18 based on a control input 20 of 1Y.

TABLE 3

| Signal | 18 | 20 | 24 |
|---|---|---|---|
| Data Value | 2X | 1Y | 1X |
| Logic Value | | ON | |
| Data Value | — | 1Y | 1Y |
| Logic Value | | ON | |
| Data Value | — | 1Y | 1Y |
| Logic Value | | ON | |
| Data Value | 2Y | 1Y | 3Y |
| Logic Value | | ON | |

Stage 2

Figure 4:
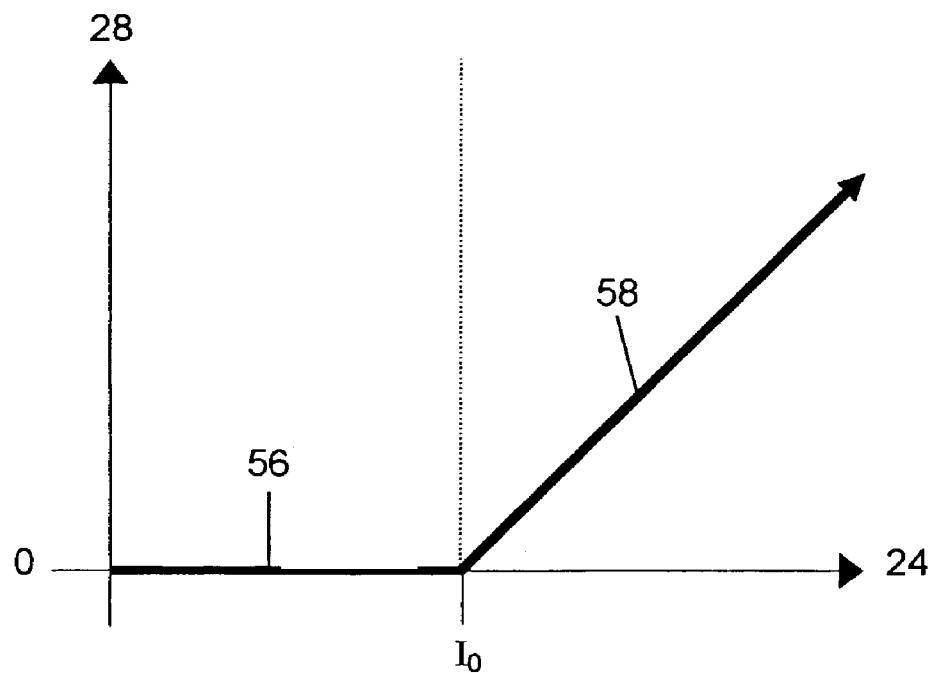
FIG. 4 provides an example operation of the absorption diode of FIG. 1.

In the filter stage 7, the signal 24 is directed into an input port 50 of an absorption diode 26, as shown in FIG. 1. The absorption diode 26 is a non-linear filtering device that functions as a threshold filter by reducing the magnitude of the signal 24 by up to a maximum constant threshold value $I_0$. The threshold $I_0$ is the level at which the magnitude of the signal 24 is equal to the maximum amount of signal filtered by the diode 26, as shown in FIG. 4. If the magnitude of the signal 24 is less than the threshold value $I_0$, the signal 24 is attenuated to a negligible level, as indicated by line 56. In this situation, the filtered signal 28 is negligible and no signal propagates to the output port 52. If the magnitude of the signal 24 is greater than the threshold value $I_0$, the diode 26 reduces the magnitude of the signal 24 by a constant amount equal to the threshold value $I_0$, regardless of how much larger the magnitude of the signal 24 is, to produce the filtered output signal 28, as indicated by line 58. Table 4 shows the filtering operation of the absorption diode 26, with a threshold value $I_0=1I$, for this example. It can be seen that the filter stage 7 conditions the three states (i.e. 1X, 1Y, 3Y) of the intermediate signal 24 so that they are mapped to the binary states (i.e. --, 2Y) of the filtered output signal 28. In this example, three states are mapped onto two corresponding states.

TABLE 4

| Signal | 24 | 28 |
|---|---|---|
| Data Value | 1X | — |
| Data Value | 1Y | — |
| Data Value | 1Y | — |
| Data Value | 3Y | 2Y |

It should be noted that the phase of the signal 24 and the phase of the filtered output signal 28 are equal when the signal 28 propagates from port 52 of the absorption diode 26.

The absorption diode 26 of the filter stage 7 can function in an on/off manner or in a threshold filtering manner. Referring to FIG. 4, the diode 26 is in an "on" state when the magnitude of the signal 24 is equal to, or greater than, the threshold value $I_0$, as indicated by line 58. The diode 26 is in an "off" state when the magnitude of the signal 24 is less than the threshold value $I_0$, as indicated by line 56. A switching operation between the on and off states can require additional time for the absorption diode 26 to react to a changing input signal 24 and change its state accordingly. Therefore, in the preferred embodiment, the magnitude of the signal 24 remains equal to, or greater than, the threshold value $I_0$. This allows the absorption diode 26 to continue operating in the on state, resulting in a faster filtering response time as compared to the off state operation. When the magnitude of the signal 24 is equal to the threshold value $I_0$, the diode 26 is in the on state, but the signal 24 is attenuated to produce an output 28 of negligible magnitude. It should be noted that in threshold filtering all signals are continuous waveforms. In the case of optical waveforms, several devices can be used as an optical absorption diode, such as an optical discriminator, a non-linear directional coupler, and an optical switch. Each device has benefits and limitations for a particular application.

A set of desirable operational characteristics for the absorption diode 26 are, but are not limited to, the following:
1. signals 24 with a magnitude equal to, or less than, the threshold value $I_0$, should be entirely attenuated;
2. operation on continuous waveforms is preferable; however, pulse and semi-continuous waveforms are also acceptable;
3. signals 24 with a magnitude greater than the threshold value $I_0$ must have at least partial transmission and may be transmitted without attenuation or may be amplified;
4. the absorption diode 26 ideally operates on single frequency waveforms, but may operate on multiple frequency waveforms in parallel processing operations;
5. there should be no variation of the phase of the signal 24 by the diode 26; however, a linear variation of the phase due to phase shifting/delay may occur; birefringence is not desirable;
6. a power source should not be required to operate the diode 26, but may be used; and
7. the absorption diode 26 should not modify the polarization or frequency of the signal 24; however, if the absorption diode 26 modifies the polarization, frequency, and/or phase of the signal 24, the polarization, frequency, and/or phase should be returned to their original states by filters or other means before the signal 28 is outputted.

In essence, any mechanism or device that completely attenuates a small magnitude input waveform and transmits, either partially or entirely, a large magnitude input waveform without adversely changing the phase, frequency, or polarization of the waveform is suitable for use as an absorption diode 26 in the filter stage 7 of the DPLG 5.

Stage 3

In the third stage 8 of the DPLG 5, the filtered signal 28 is directed into an input port 36 of a third waveform combiner 31, which has the same construction as the combiner 16 of FIG. 133. The second control input 30, with the same frequency and magnitude as the first control input 20, is directed into an input port 34 of the third combiner 31, and is combined with the filtered signal 28 to produce the binary valued output signal 32. The resultant output signal 32 (either 1X or 1Y) is a logical function of the data inputs 12, 14 based on the data values selected for the control inputs 20, 30. Table 5 lists the operation of the third waveform combiner 31 in the third stage 8.

TABLE 5

| Beam | 28 | 30 | 32 |
|---|---|---|---|
| Data Value | — | 1X | 1X |
| Logic Value | | OFF | OFF |
| Data Value | — | 1X | 1X |
| Logic Value | | OFF | OFF |
| Data Value | — | 1X | 1X |
| Logic Value | | OFF | OFF |
| Data Value | 2Y | 1X | 1Y |
| Logic Value | | OFF | ON |

DPLG Component Layout

Referring to FIG. 1, the first stage 6 of the DPLG 5 operates on the data inputs 12, 14 by directing them into the first combiner 16, which combines the inputs 12, 14 to produce the output signal 18. The second combiner 22 is positioned so that the output signal 18 of the first combiner 16 is directed into an input port 36 of the second combiner 22. The first control input 20 is directed into an input port 34 of the combiner 22. The combiner 22 combines the signals 18, 20 to produce the intermediate output signal 24 at the output port 40. The output port 40 of the second combiner 22 directs the signal 24 into the input port 50 of the absorption diode 26. In the filter stage 7, the absorption diode 26 filters the intermediate signal 24 to produce the filtered output signal 28. The output port 52 of the absorption diode 26 is positioned so that the filtered output signal 28 is directed into an input port 36 of the third combiner 31. In the third stage 8, the second control input 30 is directed into an input port 34 of the third combiner 31, which combines the signals 28, 30 to produce the binary valued output signal 32.

AND Gate Operation Summary

The binary logic value of the resultant output signal 32 is directly related to the logic values of the data inputs 12, 14 by the logic function of the DPLG 5, which is determined by the data values selected for the control inputs 20, 30. In the above example, the DPLG 5 functions as an AND Logic Gate by setting control input 20 to 1Y and control input 30 to 1X. The AND Logic Gate is summarized in Table 6 below. It should be noted that in AND Logic Gate operation all signals are preferably continuous waveforms, and that the magnitude of the intermediate signal 24 is preferably always greater than, or equal to, the threshold value $I_0$ so that the response time of the filter stage 7 is minimized.

TABLE 6

| | | | AND Gate | | | | |
|---|---|---|---|---|---|---|---|
| Beam | 12 | 14 | 18 | 20 | 24 | 28 | 30 | 32 |
| Data Value | 1X | 1X | 2X | 1Y | 1X | — | 1X | 1X |
| Logic Value | OFF | OFF | | | | | | OFF |
| Data Value | 1X | 1Y | — | 1Y | 1Y | — | 1X | 1X |
| Logic Value | OFF | ON | | | | | | OFF |
| Data Value | 1Y | 1X | — | 1Y | 1Y | — | 1X | 1X |
| Logic Value | ON | OFF | | | | | | OFF |
| Data Value | 1Y | 1Y | 2Y | 1Y | 3Y | 2Y | 1X | 1Y |
| Logic Value | ON | ON | | | | | | ON |

OR Gate Example

The same configuration of components may also be used to provide a logical OR function. The OR Logic Gate operation is obtained by setting control input 20 to IX and control input 30 to 1Y. The OR Logic Gate operation is summarized in Table 7.

TABLE 7

| | | | OR Gate | | | | |
|---|---|---|---|---|---|---|---|
| Beam | 12 | 14 | 18 | 20 | 24 | 28 | 30 | 32 |
| Data Value | 1X | 1X | 2X | 1X | 3X | 2X | 1Y | 1X |
| Logic Value | OFF | OFF | | | | | | OFF |
| Data Value | 1X | 1Y | — | 1X | 1X | — | 1Y | 1Y |
| Logic Value | OFF | ON | | | | | | ON |
| Data Value | 1Y | 1X | — | 1X | 1X | — | 1Y | 1Y |
| Logic Value | ON | OFF | | | | | | ON |
| Data Value | 1Y | 1Y | 2Y | 1X | 1Y | — | 1Y | 1Y |
| Logic Value | ON | ON | | | | | | ON |

Again, it should be noted that all signals are preferably continuous waveforms, and that the magnitude of the signal 24 is preferably always greater than, or equal to, the threshold value $I_0$ in the filter stage 7, so that the response time of the filter stage 7 is minimized.

Tri-State Operation

Figure 5:
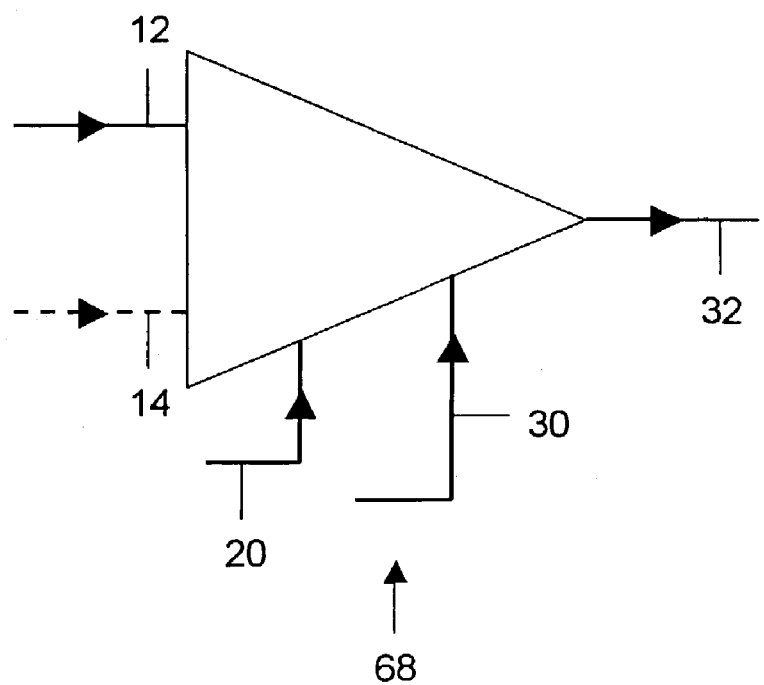
FIG. 5 is a symbolic representation of a tri-state device.

Besides functioning as the AND or OR gates, as described above, a third function of the DPLG 5 is a tri-state device 68, shown in FIG. 5 and Table 8. In this case, only a single input 12 is used, but the control signals 20, 30 may be adjusted to provide three possible outputs.

TABLE 8

| Beam | 12 | 20 | 24 | 28 | 30 | 32 |
|---|---|---|---|---|---|---|
| Data Value | 1X | — | 1X | — | — | — |
| Logic Value | OFF | | | | | |
| Data Value | 1Y | — | 1Y | — | — | — |
| Logic Value | ON | | | | | |
| Data Value | 1X | 2X | 3X | 2X | 1Y | 1X |
| Logic Value | OFF | | | | | OFF |
| Data Value | 1Y | 2X | 1X | — | 1Y | 1Y |
| Logic Value | ON | | | | | ON |
| Data Value | 1X | 2Y | 1Y | — | 1X | 1X |
| Logic Value | OFF | | | | | OFF |
| Data Value | 1Y | 2Y | 3Y | 2Y | 1X | 1Y |
| Logic Value | ON | | | | | ON |

The filter stage 7 threshold value $I_0$ is selected so that the resultant output signal 32 of the tri-state device 68 is negligible when the control inputs 20, 30 are negligible. When the magnitudes of control inputs 20, 30 and the data input 12 have a ratio of 2:1:1, respectively, the data value of the resultant output waveform 32 is the same as that of the data input 12. Again, it should be noted that the data input signal 12 is preferably a continuous waveform, and that the magnitude of signal 24 is preferably always greater than, or equal to, the threshold value $I_0$ in the filter stage so that the response time of the filter stage 7 is minimized. The first control input 20 and the data input 12 are combined to produce the input signal 24 for the filter stage 7. The filtered signal 28 is combined with the second control input 30 to form the resultant output signal 32. It should also be noted that interchanging the phase values of the control inputs 20, 30 does not affect the operation of the tri-state device 68, as shown in Table 8. However, the phase values of the control inputs 20, 30 must be opposite. In tri-state operation the data input 14 is not used and is always negligible. The tri-state device 68 outputs three possible data values, 1X, 1Y, and no beam --, that correspond to the ON, OFF, and high impedance states, respectively, of a traditional electronic tri-state device. The tri-state device 68 can be useful for dynamically nullifying the influence of the DPLG 5 in a circuit, where the output signal 32 of the DPLG 5 is interfaced to a connection common to the outputs of a number of logic devices and only one device is permitted to output at a time.

Data Value Detector Example

Figure 6:
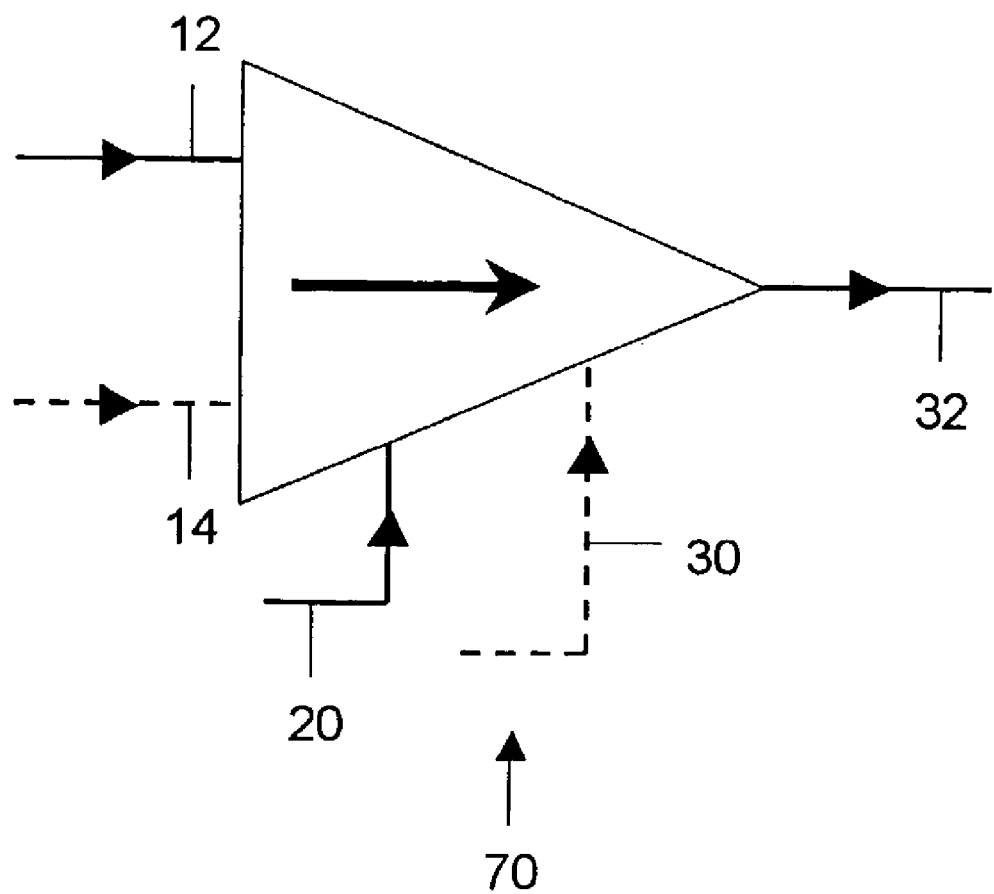
FIG. 6 is a symbolic representation of a data value detector.

A fourth function of the DPLG 5 is a data value detector 70, shown in FIG. 6 and Table 9. The detector 70 has the same configuration as the DPLG 5 of FIG. 1. In this operation, the first control input 20 has a selected phase and the data input 14 and the second control input 30 are negligible. Table 9 lists several examples of data value detector 70 operation.

TABLE 9

| Row | Beam | 12 | 20 | 24 | 32 |
|---|---|---|---|---|---|
| 1 | Data Value | 2Y | 1Y | 3Y | 2Y |
| 2 | Data Value | 2X | 1Y | 1X | — |
| 3 | Data Value | 4X | 1Y | 3X | 2X |

The data value detector 70 performs phase detection relative to the phase of the control input 20 by differentiating between data value inputs 12 having different phases and equal magnitudes. A data input 12 that has a phase equal to the phase of the control input 20 is reproduced at the detector output 32 and thus detected, as shown in row 1 in Table 9. A data input 12 that has a phase opposite to the phase of the control input 20 is attenuated and, therefore, not detected, as shown in row 2.

The data value detector 70 also performs magnitude detection by differentiating between data value inputs 12 having the same phase but different magnitudes. A data input 12 that has a magnitude greater than the combined magnitudes of the control input 20 and the absorption diode 26 threshold value $I_0$ is partially attenuated and thus detected, as shown in row 3 of Table 9. However, if the data input 12 has a magnitude less than the combined magnitudes of the control input 20 and the threshold value $I_0$, the signal 24 is attenuated and thus is not detected, as shown in row 2 of Table 9. It should be noted that, in magnitude detection, the phase of the control input 20 must be opposite to the phase of the data input signal 12.

It should also be noted that for the detector 70 to operate in a threshold manner the data input 12 must be a continuous waveform. As well, if the data input 12 is opposite in phase to the control input 20, the magnitudes of the data input 12, the control input 20, and the threshold value $I_0$ of the absorption diode 26 should have a ratio of at least 2:1:1, respectively. The data input 12 can have a ratio greater than 2 (e.g. 4:1:1). The data input 12 preferably has an even magnitude and the control input 20 preferably has an odd magnitude. The ratio of at least 2:1:1 ensures that the combination of the signals 12, 20, and thus the input 18 to the absorption diode 26, is not less than the threshold value $I_0$ of the diode 26. An example application of the data value detector 70 is in memory cells, where the detector 70 can be used for detecting a combined row and column memory access signal.

DPLG Dynamic Operation

Figure 7A:
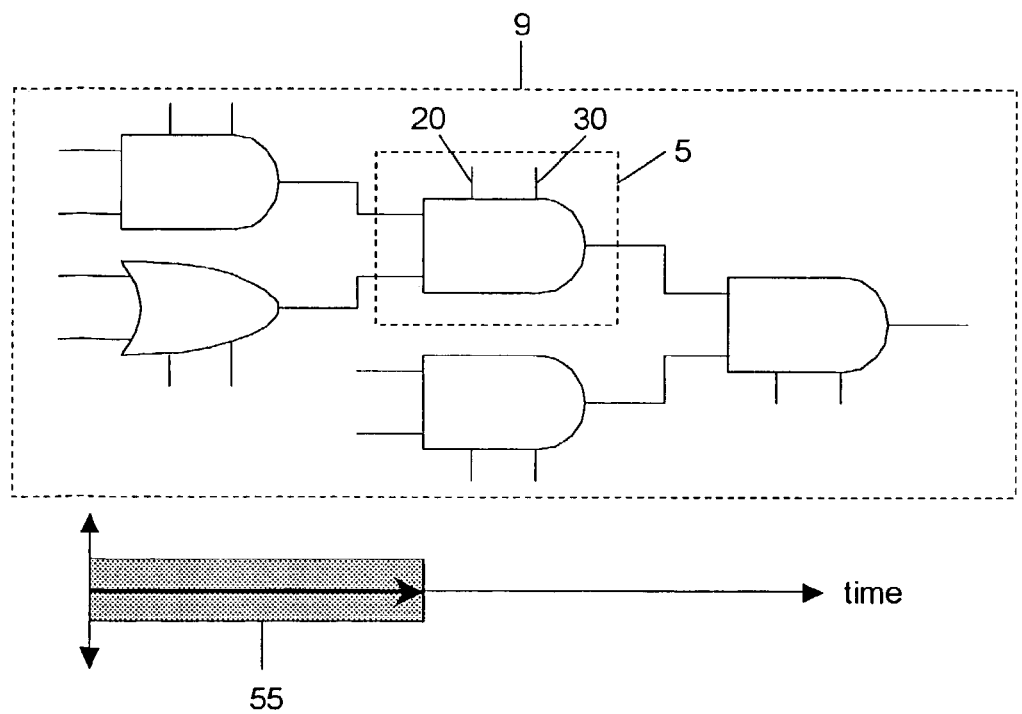
FIG. 7 shows example dynamic operation of the DPLG of FIG. 1.
Figure 7B:
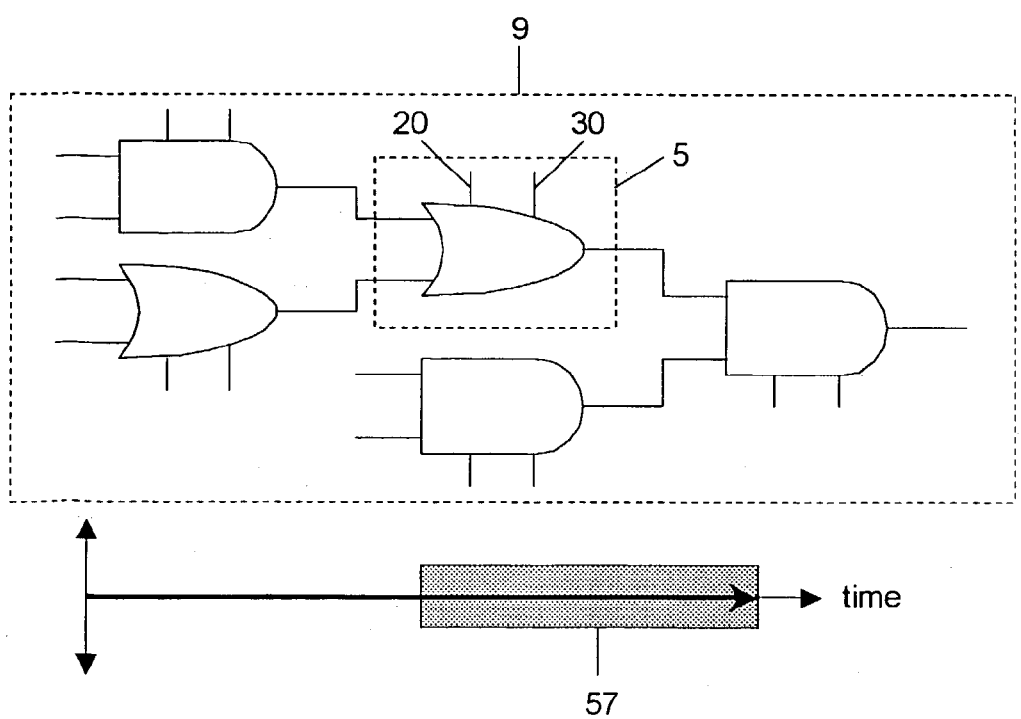

In static operation, the DPLG 5 can be programmed to function as a dedicated logic gate, such as an AND Gate or an OR Gate, by selecting the data values of the control inputs 20, 30. However, by changing the control inputs 20, 30 during operation, the logic function of the DPLG can be dynamically programmed, as desired. For example, when placed in a circuit 9, shown in FIG. 7, the DPLG 5 can be used as an AND Gate, as shown in Table 6 and FIG. 7a, for a measured time period 55. Then, the data values of the control inputs 20, 30 can be changed to reprogram the DPLG 5 to function as an OR Gate, as shown in Table 7 and FIG. 7b, for a subsequent measured time period 57. The DPLG 5 functional states can be changed as desired during the circuit 9 operation, hence providing the dynamic and programmable functionality of the DPLG 5.

Figure 8:
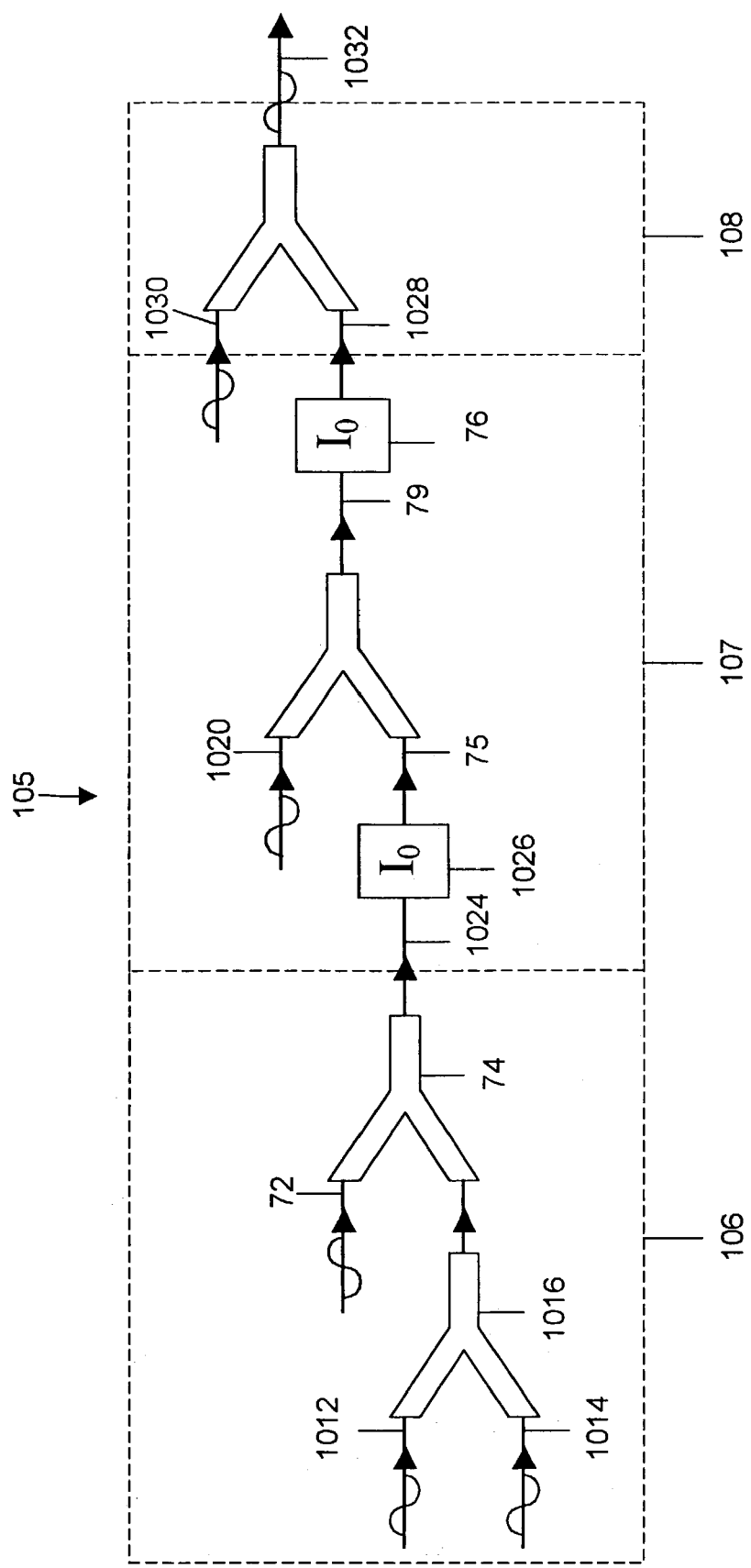
FIG. 8 is an alternative embodiment of FIG. 1.

Referring to FIG. 8, an alternative embodiment of the present invention is a three data input DPLG 105, where like numerals with a prefix 10 refer to similar elements of the DPLG 5 in FIG. 1. In the first stage 106, three data inputs 1012, 1014, 72 are directed into the two combiners 1016, 74 to produce an intermediate output signal 1024. In the filter stage 107, a pair of absorption diodes 1026, 76 and a control input 1020 are used to produce a filtered signal 1028. In the third stage 108, a control input 1030 is combined with the filtered signal 1028 to produce a resultant binary valued output signal 1032, which has the same frequency and magnitude as the inputs 1012, 1014, 72. An example three input AND Logic Gate using the DPLG 105 is given in Table 10 below. In this example, 1X is defined as logical ON and 1Y is defined as logical OFF. The first absorption diode 1026 is employed to reduce the four states (i.e. 3X, 3Y, 1Y, 1X) of the intermediate signal 1024 to the three states (i.e. 2X, 2Y, and --) of an intermediate beam 75. The second absorption diode 76 and the first control input 1020 are used to reduce the three states (i.e. 1X, 1Y, and 3Y) of an intermediate filtered beam 79 to the two binary states (i.e. 2Y or --) of the filtered signal 1028. It is recognized that the number of inputs 1012, 1014, 72 can be greater than three with a corresponding increase in the number of diodes 1026, 76, and a corresponding increase in the number of control signals 1020, 1030.

TABLE 10

| Beam | 1012 | 1014 | 72 | 1024 | 75 | 1020 | 79 | 1028 | 1030 | 1032 |
|---|---|---|---|---|---|---|---|---|---|---|
| Data Value | 1X | 1X | 1X | 3X | 2X | 1Y | 1X | — | 1X | 1X |
| Logic Value | ON | ON | ON | | | | | | | ON |
| Data Value | 1X | 1X | 1Y | 1X | — | 1Y | 1Y | — | 1X | 1X |
| Logic Value | ON | ON | OFF | | | | | | | ON |
| Data Value | 1X | 1Y | 1X | 1X | — | 1Y | 1Y | — | 1X | 1X |
| Logic Value | ON | OFF | ON | | | | | | | ON |
| Data Value | 1X | 1Y | 1Y | 1Y | — | 1Y | 1Y | — | 1X | 1X |
| Logic Value | ON | OFF | OFF | | | | | | | ON |
| Data Value | 1Y | 1X | 1X | 1X | — | 1Y | 1Y | — | 1X | 1X |

TABLE 10-continued

| Beam | 1012 | 1014 | 72 | 1024 | 75 | 1020 | 79 | 1028 | 1030 | 1032 |
|---|---|---|---|---|---|---|---|---|---|---|
| Logic Value | OFF | ON | ON | | | | | | | ON |
| Data Value | 1Y | 1X | 1Y | 1Y | — | 1Y | 1Y | — | 1X | 1X |
| Logic Value | OFF | ON | OFF | | | | | | | ON |
| Data Value | 1Y | 1Y | 1X | 1Y | — | 1Y | 1Y | — | 1X | 1X |
| Logic Value | OFF | OFF | ON | | | | | | | ON |
| Data Value | 1Y | 1Y | 1Y | 3Y | 2Y | 1Y | 3Y | 2Y | 1X | 1Y |
| Logic Value | OFF | OFF | OFF | | | | | | | OFF |

Figure 9:
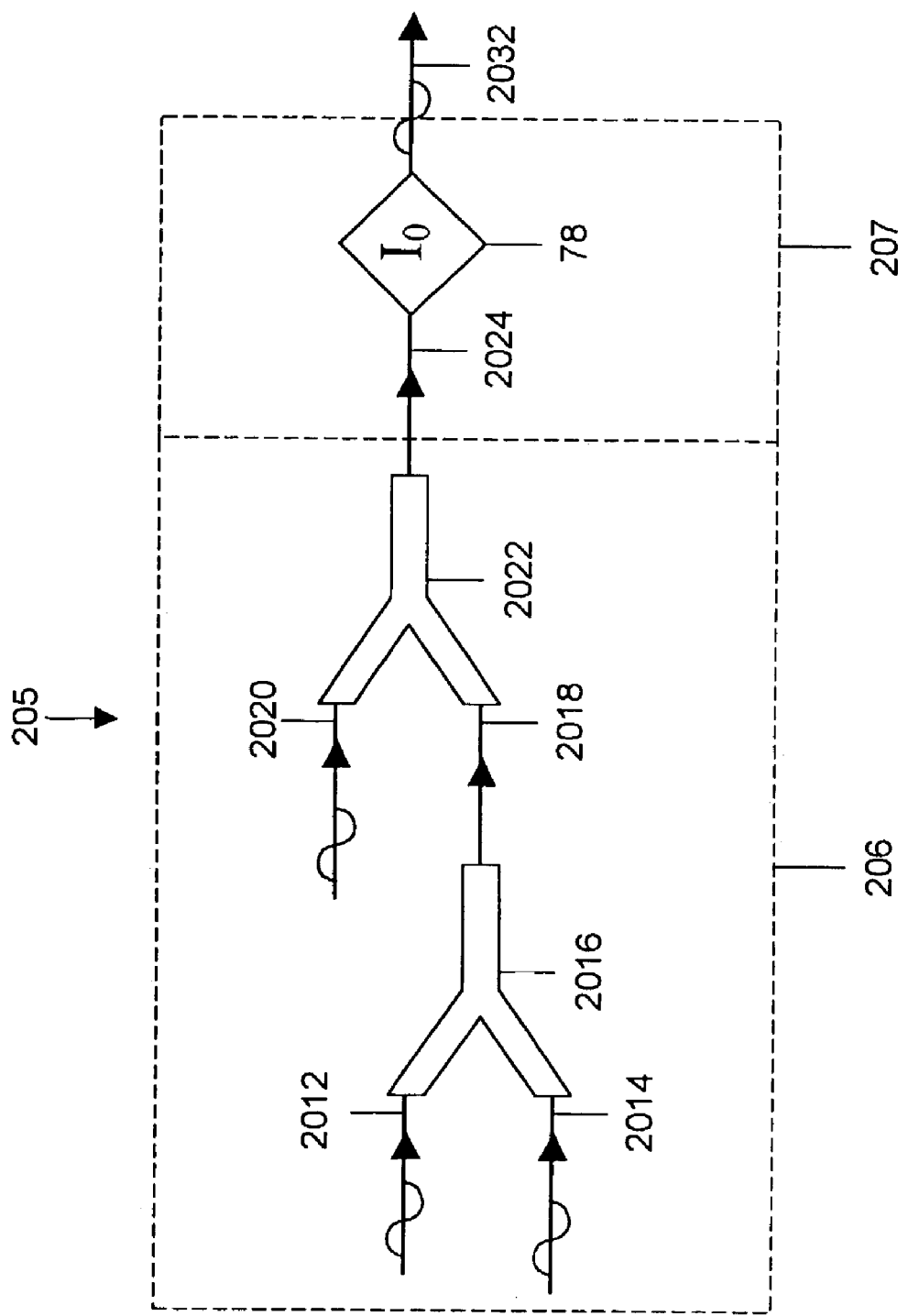
FIG. 9 is a further alternative embodiment of FIG. 1.

A further embodiment of the DPLG 5 employs a magnitude limiter 78 in a filter stage 207 of a DPLG 205, as shown in FIG. 9, where like numerals with a prefix 20 refer to similar elements of the DPLG 5 in FIG. 1. In the first stage 206, the DPLG 205 has a pair of data inputs 2012, 2014 combined by a first combiner 2016 to produce a signal 2018. A control input 2020 is combined with the signal 2018 by a second combiner 2022 to produce an intermediate output signal 2024. The magnitude limiter 78 is employed during the filter stage 207 to limit the magnitude of the signal 2024 to a maximum $I_{Limit}$ 80, producing a binary valued output signal 2032, that has the same frequency and magnitude as the inputs 2012, 2014. It should be noted that the DPLG 205 does not use a stage similar to the third stage 8 of FIG. 1. In the DPLG 205, the magnitude limiter 78 maps the three states (1X, 1Y, and 3Y) of signal 2024 onto the two states (1X and 1Y) of signal 2032.

Figure 10:
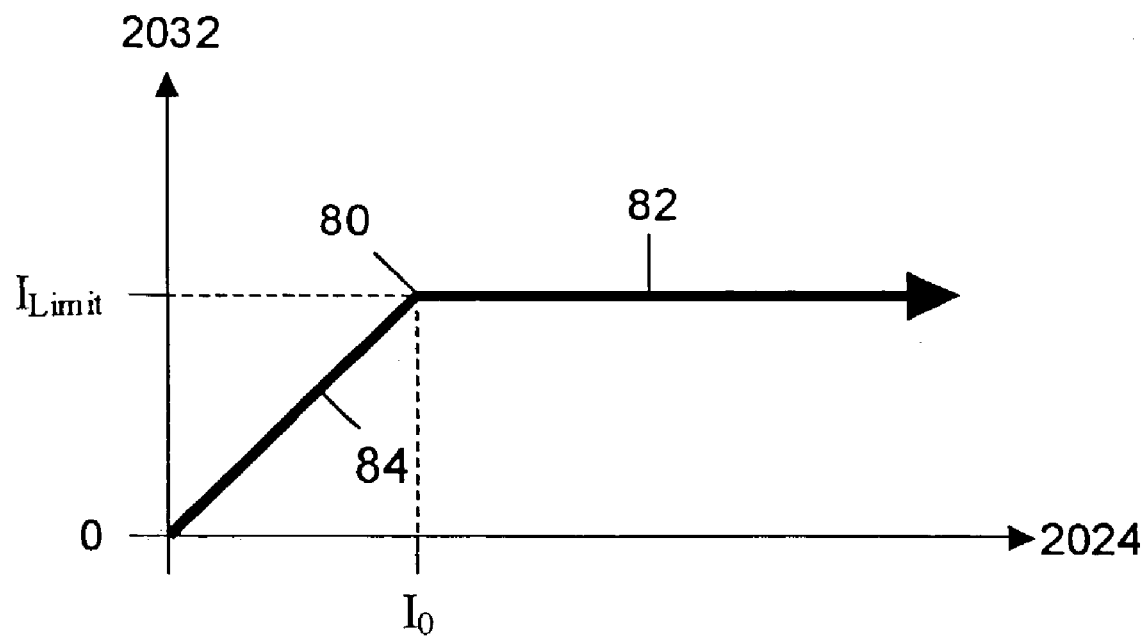
FIG. 10 provides an example operation of a magnitude limiter of FIG. 9.

The magnitude limiter 78 is a non-linear filtering device that limits the output 2032 to the maximum magnitude of $I_{Limit}$ 80, as shown in FIG. 10. The limiter 78 increases the amount of signal 2024 absorbed as the magnitude of the signal 2024 increases beyond a limit value $I_0$, as indicated by a horizontal line 82. It should be noted that inputs 2024 below the limit value $I_0$ are preferably not affected by the limiter 78, as indicated by line 84. Examples of magnitude limiter operation are given in Table 11.

TABLE 11

| Beam | 2024 | $I_{Limit}$ 80 | Beam 2032 |
|---|---|---|---|
| Data Value | 0X | 2I | 0X |
| Data Value | 1X | 2I | 1X |
| Data Value | 2X | 2I | 2X |
| Data Value | 3X | 2I | 2X |

Example devices that perform as magnitude limiters 78, in the case of optical waveforms, include optical limiters, such as fullerenes, indium antimonide, and liquid crystal. Each device has benefits and limitations for a particular application.

A set of the desirable operational characteristics for the magnitude limiter 78 are, but are not limited to, the following:

1. signals 2024 with a magnitude greater than the limit value $I_0$ are filtered to a maximum of $I_{Limit}$ 80;
2. operation on continuous waveforms is preferable; however, pulse and semi-continuous waveforms are also acceptable;
3. signals 2024 with a magnitude less than the limit value $I_0$ are preferably transmitted unaffected, but may be amplified to a maximum of $I_{Limit}$ 80 or partially reduced;
4. the magnitude limiter 78 ideally operates on single frequency waveforms, but may operate on multiple frequency waveforms in parallel processing operations;
5. there should be no variation of the phase of the signal 2024 by the limiter 78; however, a linear variation of the phase due to phase shifting/delay may occur; birefringence is not desirable;
6. a power source should not be required, but may be used; and
7. the magnitude limiter 78 should not modify the polarization or frequency of the signal 2024; however, if the limiter 78 modifies the polarization, frequency, and/or phase of the signal 2024, the polarization, frequency, and/or phase should be returned to their original states by filters or other means before the signal 2032 is outputted.

In essence, any mechanism or device that entirely, or partially, transmits a small magnitude input waveform and transmits a same magnitude waveform for any large magnitude waveform without adversely changing the phase, frequency, or polarization of the input is suitable for use as the magnitude limiter 78 in the filter stage 207 of the DPLG 205.

Although the magnitude limiter based DPLG 205 of FIG. 9 is generally not as fast as the absorption diode based DPLG 5 of FIG. 1, it does provide another method of performing dynamic phase logic with fewer components. Selection of DPLG 205 over DPLG 5 may be necessary in situations where design space is more important than speed, since the DPLG 205 may be smaller in size due to the use of fewer components. Table 12 shows the DPLG 205 operation, where the control input 2020 is set to 1Y for OR Logic Gate operation.

TABLE 12

| Beam | 2012 | 2014 | 2018 | 2020 | 2024 | 2032 |
|---|---|---|---|---|---|---|
| Data Value | 1X | 1X | 2X | 1Y | 1X | 1X |
| Logic Value | OFF | OFF | | | | OFF |
| Data Value | 1X | 1Y | — | 1Y | 1Y | 1Y |
| Logic Value | OFF | ON | | | | ON |
| Data Value | 1Y | 1X | — | 1Y | 1Y | 1Y |
| Logic Value | ON | OFF | | | | ON |
| Data Value | 1Y | 1Y | 2Y | 1Y | 3Y | 1Y |
| Logic Value | ON | ON | | | | ON |

It is recognized that the number of inputs 2012, 2014 can be greater than two, with a corresponding increase in the number of magnitude limiters 78 and an associated increase in the number of control signals 2020.

Figure 11:
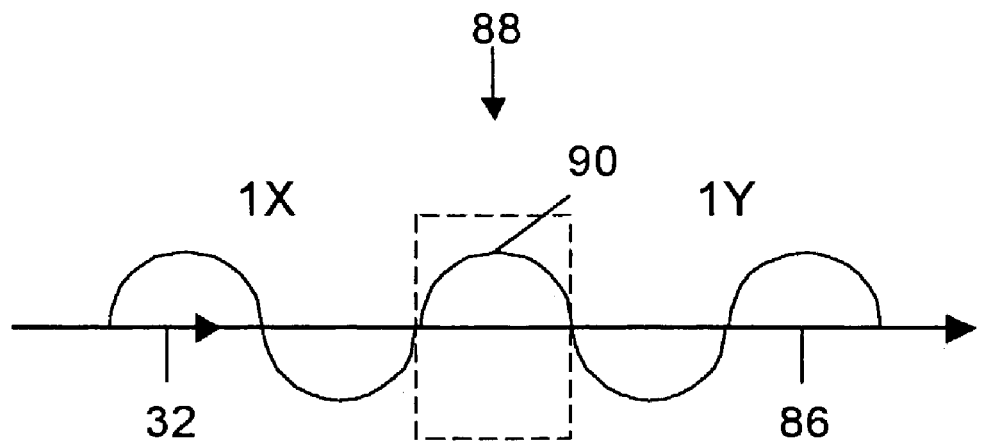
FIG. 11 shows a schematic of an inverter.

Boolean logic states that all logic functions can be entirely described in terms of AND logic functions and NOT logic functions or in terms of OR logic functions and NOT logic functions. A NOT logic function provides an inverted output 86, relative to an input 32, and can be obtained using a data value inverter 88, as shown in FIG. 11. The path length of the signal 32 is changed by a half wavelength 90, thereby changing the phase of the signal 32 from the 1X to the 1Y data value or vice versa. The inverter 88 can be used independently to provide the NOT logic function or it can be used in combination with the DPLG 5, 105, 205 to produce inverted logic operations, such as a NAND or NOR logic gate, thus providing all of the required Boolean logic functions.

It should be recognized that a complete list of all the functions of the DPLG 5 is impractical because of the large number of input combinations. Since the DPLG 5 has four inputs, there are 64 possible combinations of those inputs using a three data value input set of 1X, --, and 1Y. Further combinations are possible for more input values. For example, if a five data value input set of 2X, 1X, --, 1Y, and 2Y is used for the four inputs, there are $5^4$=625 possible outputs. For this reason, only the four example functions, AND, OR, tri-state, and data value detector, are described in detail. It should also be noted that these four functions categorize and describe only 24 of the total discrete data value input combinations. Although the DPLG 5 is ideally suited for digital operation, this capability does not preclude its use as an analog device. The data value detector operation of the DPLG 5 is one such function that is capable of operating on analog signals. Analog functions are not explicitly defined because of the large number of input combinations.

The DPLG 5 can also operate in a parallel processing manner. Parallel processing may be achieved by simultaneously encoding more than one piece of information into a signal. For example, in an optical embodiment two independent pieces of information can be encoded into a beam at the same time by using two orthogonal polarizations.

DPLG in Circuits

Figure 12:
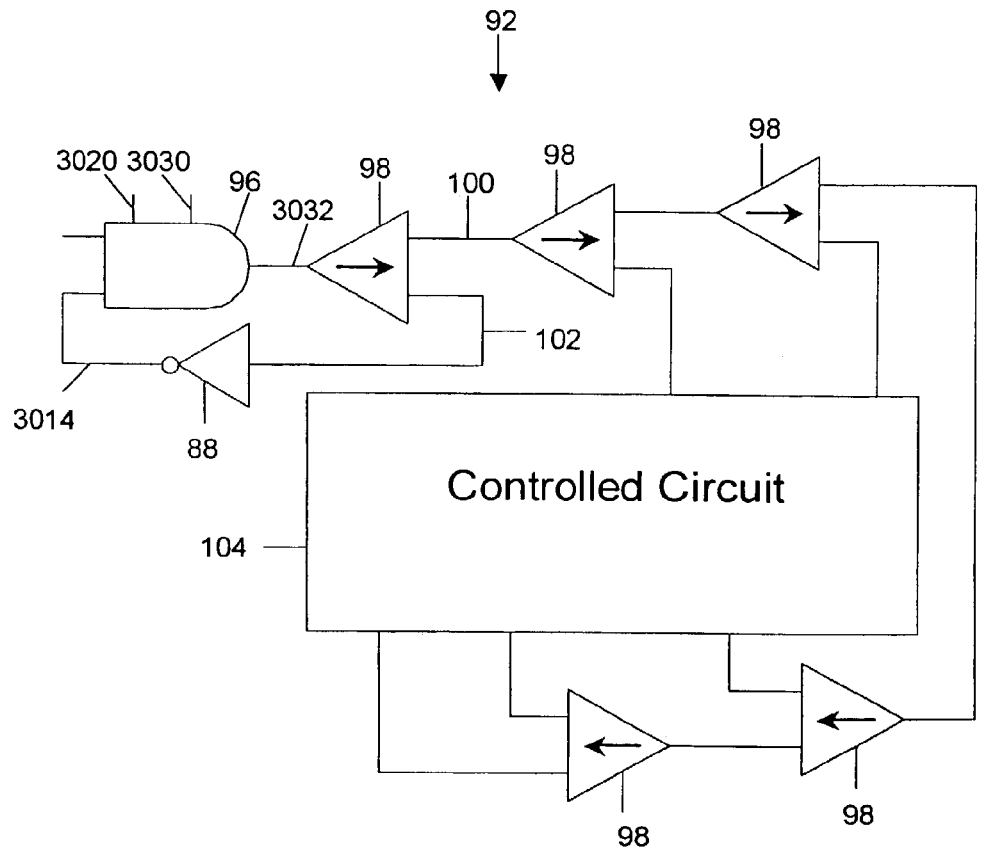
FIG. 12 is a schematic of an oscillator using a DPLG of FIG. 1.

Another feature of the DPLG 5 is that it can be used to create combinational and sequential digital logic circuits. The basic functions of the DPLG 5 enable it to be used to construct complex circuits, such as oscillators, memory cells, adders, algorithmic state machines, and complete CPUs, which are traditionally made with electrical logic devices. Due to complexity, only an oscillator circuit 92, a Read Only Memory (ROM) circuit 94, and a Random Access Memory (RAM) circuit 95 are described with reference to FIGS. 12, 13, and 14, where like numerals with a prefix 30 refer to similar elements of the DPLG 5 in FIG. 1.

An oscillator circuit 92 is constructed using the DPLG 5 functioning as an AND gate 96, where the control inputs 3020, 3030 are selected as 1Y and 1X, respectively. A sustained signal branch (SSB) 98, that receives the binary valued output signal 3032 of the AND Gate 96, doubles the magnitude of the signal 3032 and splits it into two separate signals 100, 102. These signals 100, 102 are preferably identical to the original signal 3032 in frequency, polarization, phase, and magnitude. A data value inverter 88 is used to apply a NOT function to the signal 102 thus producing the second data input 3014 to the AND gate 96. The signal 100 is propagated by subsequent SSBs 98 for use in a controlled circuit 104. One application of the oscillator circuit 92 is as a system clock for the circuit 104.

Figure 13:
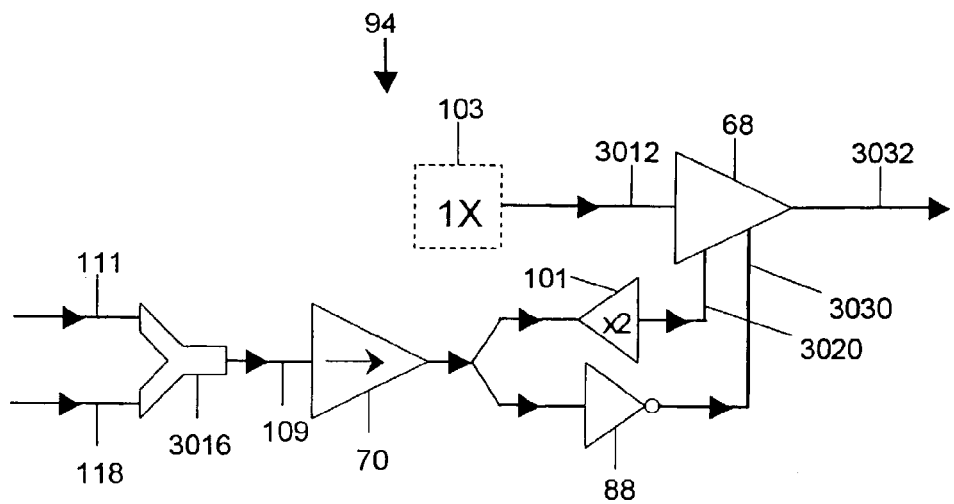
FIG. 13 is a schematic of a ROM circuit using DPLGs of FIG. 1.

The ROM circuit 94, as shown in FIG. 13, is constructed using two functions of the DPLG 5: the tri-state device 68 and the data value detector 70. The input 3012 of the tri-state device 68 is a constant signal memory data bit 103. A memory control signal 111 of 1X or 1Y is combined with a constant signal 118 of 1Y, for example, in a combiner 3016 to produce a memory cell control signal 109 having a value of 2Y or --, for example. When the data value detector 70, functioning as a magnitude detector, detects a large magnitude signal 109 of 2Y, for example, it turns on the tri-state device 68, via the control inputs 3020, 3030, by using a doubling amplifier 101, that produces an output with twice the magnitude of the input, and a data value inverter 88. The tri-state data input signal 3012 is thus transmitted to the memory cell output signal 3032.

Figure 14:
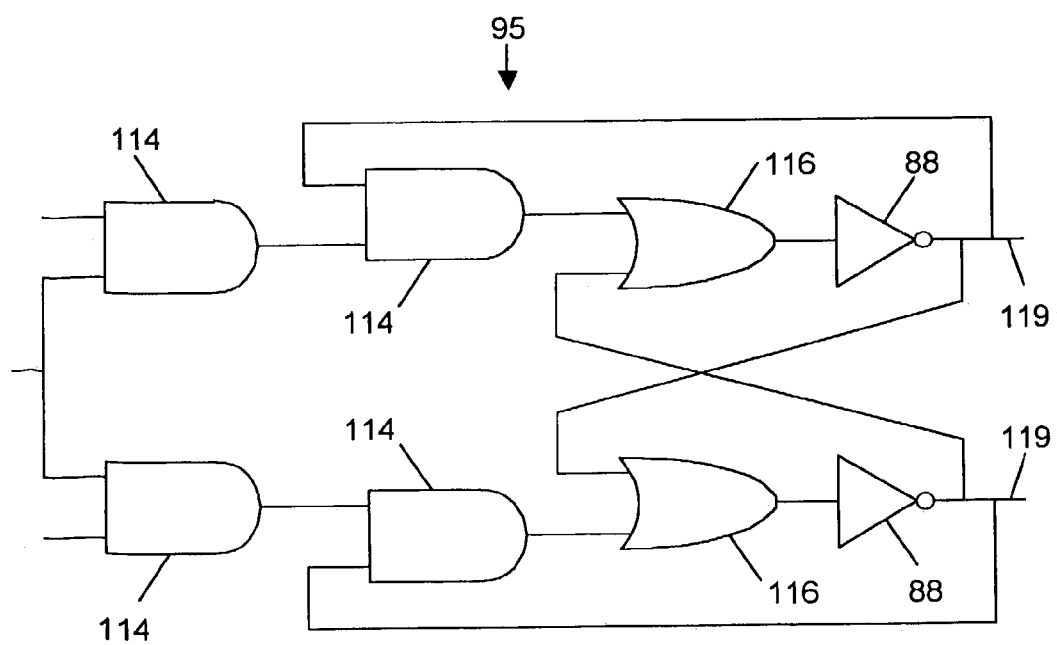
FIG. 14 is a schematic of a RAM circuit using DPLGs of FIG. 1.

The RAM circuit 95 is constructed using standard logic designs, such as a flip-flop arrangement, shown in FIG. 14. The circuit 95 employs the DPLG 5 functioning as an AND Gate 114 and as an OR Gate 116, in combination with the data value inverter 88 to produce memory outputs 119.

Optical DPLG's

When the signals in the circuits 92, 94, 95 described above are optical waveforms, preferably laser light, the absorption diode based DPLG 5, 105 and the magnitude limiter based DPLG 205 are modular devices made up of a combination of commonly available semiconductor integrated optic components. The semiconductor wafer technology of the integrated optics is preferably capable of resolving a half wavelength of the light used for the input signals so that the path lengths of all light beams can be designed and manufactured to a half wavelength increment. For example, if 0.5 μm wavelength light is used for the input signals, a semiconductor wafer technology with a 0.25 μm resolution is preferred to produce half wavelength path lengths. Current fabrication processes for integrated optic devices are well known in the art and typically have a minimum resolution of 0.25–0.15 μm. Therefore, light with wavelengths such as 0.5 μm, 0.3 μm, or 0.6 μm can be readily used in a DPLG 5 manufactured with the current technology.

Figure 15:
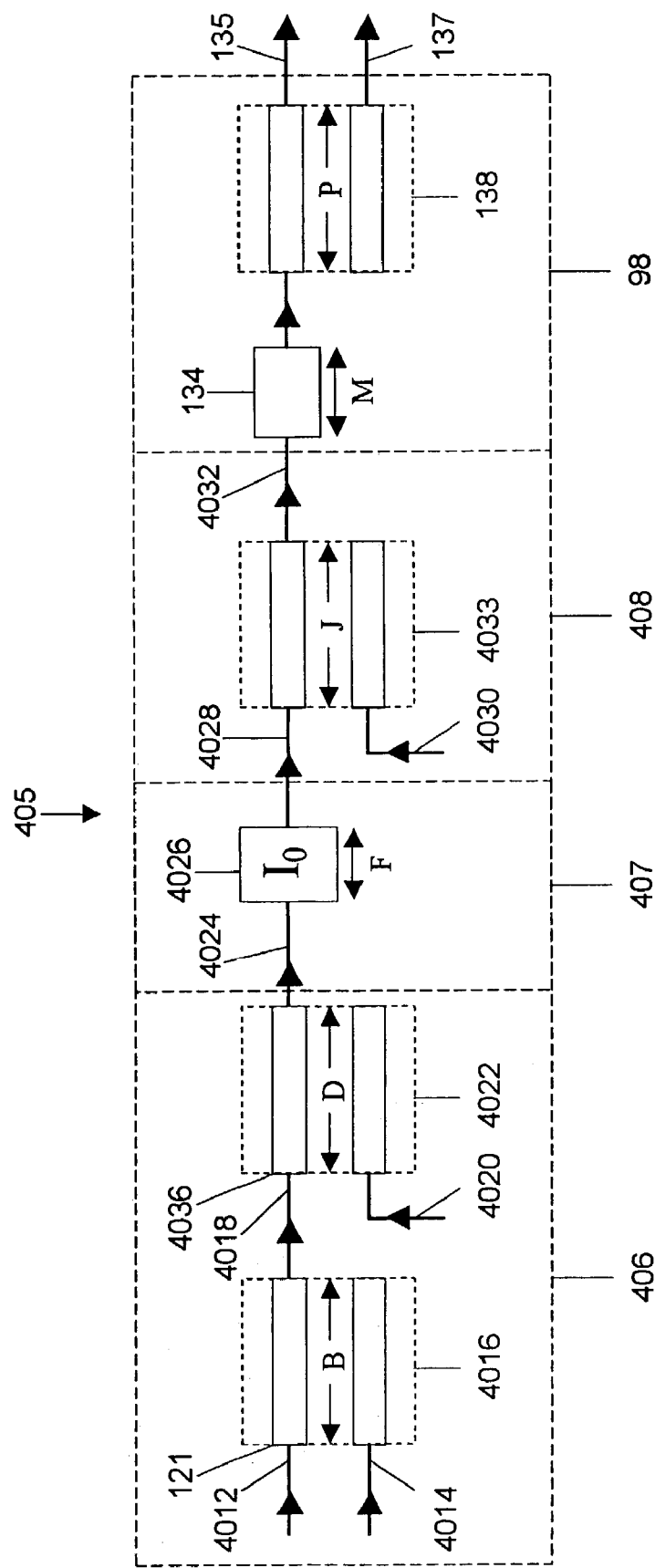
FIG. 15 is a design example of FIG. 1.
Figure 16:
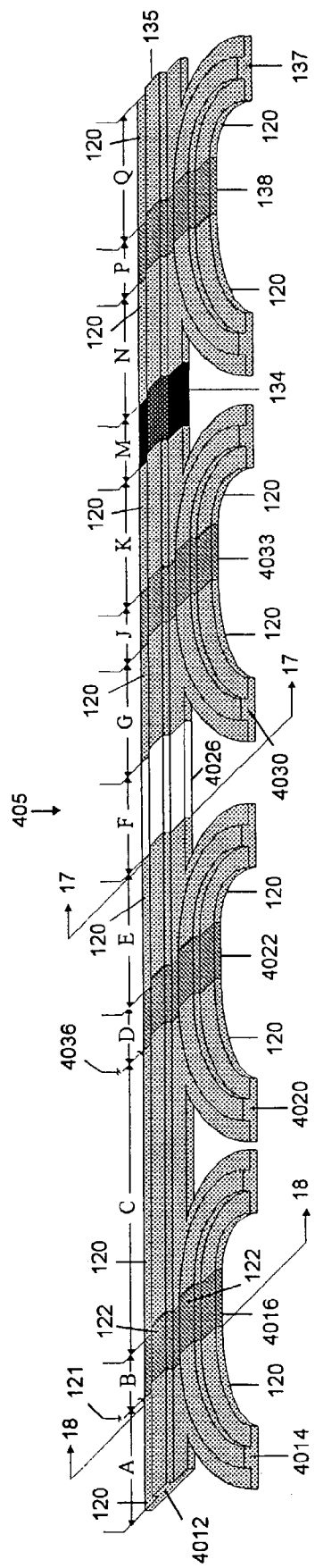
FIG. 16 is a perspective view of FIG. 15.

A design example DPLG 405, shown in FIGS. 15 and 16 where numerals with a prefix 40 refer to similar elements of the DPLG 5 in FIG. 1, uses the above mentioned manufacturing considerations and a resolution of 0.1 μm. Table 13 lists the dimensions of the DPLG 405.

TABLE 13

| Component | Length |
|---|---|
| A | 102.0 μm |
| B | 157.1 μm |
| C | 213.6 μm |
| D | 123.1 μm |
| E | 97.9 μm |
| F | 50.0 μm |
| G | 105.9 μm |
| J | 136.8 μm |
| K | 101.2 μm |
| M | 300.0 μm |
| N | 98.0 μm |
| P | 157.1 μm |
| Q | 97.9 μm |

Continuous coherent light beams with a wavelength λ=0.85 μm are used for the input beams 4012, 4014, 4020, 4030. Optical combiners, such as directional couplers or "Y" junction integrated waveguides, are used for waveform combiner 16 to combine light beams and are also used as light beam splitters.

Integral path lengths and half-integral path lengths are required for all beams in the DPLG 405 so that accurate data values are maintained. Waveguides 120 are used to interconnect the directional couplers 4016, 4022, 4033 and the optical absorption diode 4026. The directional couplers 4016, 4022, 4033 and the waveguides 120 are composed of $Al_{0.3}Ga_{0.7}As$ or $Al_{0.8}Ga_{0.2}As$ and their lengths can be chosen so as to maintain integral path lengths from component to component. However, the refractive index of the material slows the speed of a propagating light beam and thereby modifies the wavelength, and thus the phase, of the beam. Therefore, an integral path length must account for the refractive index of the material as $$\frac{\eta}{\lambda}L = \# \text{ wavelengths}$$

where η is the refractive index of the material, λ is the wavelength of light used, and L is the path length. For example, the distance from the input port 121 of the first directional coupler 4016 to the input port 4036 of the second directional coupler 4022 is $$\frac{3.35}{0.85 \ \mu m}(157.1 \ \mu m + 213.6 \ \mu m) = 1461 \text{ integral wavelengths}$$

where η=3.35, λ=0.85 μm, and L=(157.1+213.6) μm.

Figure 17:
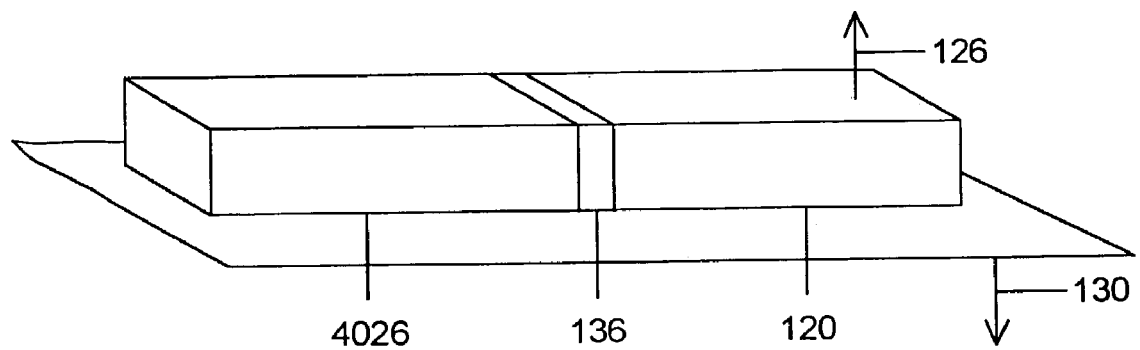
FIG. 17 is a section 17—17 view of FIG. 16.
Figure 19:
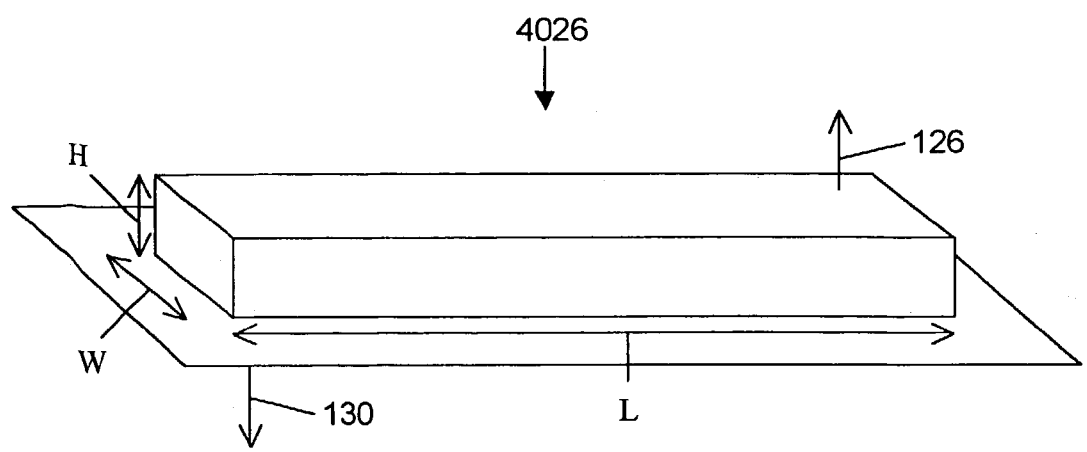
FIG. 19 is a further section 17—17 view of FIG. 16.

As shown in FIG. 17, a path length can be modified by using an optical waveguide extension 136 to correct path length errors. The extension 136 can be composed of a material with a refractive index different from, or preferably similar to, the refractive index of the adjoining waveguide path length material and is designed based on the available manufacturing resolution. For example, the optical absorption diode 4026 of FIG. 19 is 50.0 μm in length and has η=4.3287 corresponding to 254.63 wavelengths. An extension 136 of 0.6 μm in length with η=3.35 produces the combined integral path length of 257 wavelengths based on a λ=0.85 μm.

Figure 18:
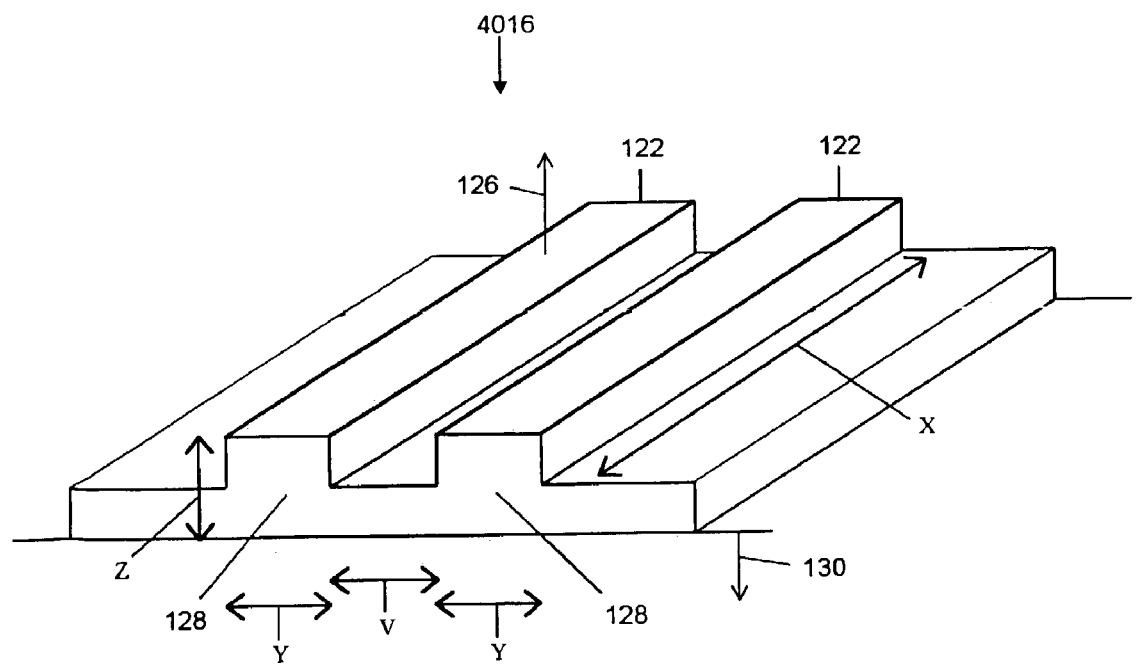
FIG. 18 is a section 18—18 view of FIG. 16.

In the first stage 406 of the DPLG 405, the first directional coupler 4016, shown in FIG. 18, is composed of two parallel waveguides 122 and performs irradiance combining of the two input beams 4012, 4014. The dimensions of the coupler 4016 are given in Table 14.

TABLE 14

| Label | Size |
|---|---|
| V | 1.0 μm |
| X | 157.1 μm |
| Y | 1.0 μm |
| Z | 0.5 μm |

A cover material 126 is typically air with an index of refraction of 1.0. A waveguide portion 128 has an index of refraction of 3.35 and a substrate 130 has an index of refraction of 3.12. The coupling coefficient of the coupler 4016 is 0.005 μm$^{-1}$. The remaining couplers 4022, 4032 have the same design (except for the length) and, therefore, will not be described further.

In the filter stage 407, the optical absorption diode 4026 operates on the intermediate output beam 4024 of the coupler 4022. In this optical example, the optical absorption diode 4026 is composed of a GaSb material. At small magnitudes, the GaSb material is opaque and, therefore, absorbs the beam 4024. As the magnitude of the beam 4024 is increased, the amount of absorption increases. At the threshold value $I_0$, the diode 4026 enters the on state and the material becomes semi-transparent. As the magnitude of the beam 4024 is increased further (i.e. greater than the threshold value $I_0$), a portion of the beam 4024 is transmitted as beam 4028.

A number of detailed equations have been derived that describe the absorption of light in a material. For low irradiance light, each equation approximates to the Lambert/Beer Law of light extinction. A different approximation is made for high irradiance light. However, for light that is neither low irradiance nor high irradiance, an entire equation must be used without making any approximations. By manipulating the equations, two parameters, $D_{param}$ and $M_{param}$ that are useful for absorption diode design can be derived.

FIG. 19 shows the optical absorption diode 4026 with the dimensions listed in Table 15.

TABLE 15

| Label | Size |
|---|---|
| L | 50.0 μm |
| H | 0.5 μm |
| W | 1.0 μm |

An additional parameter, the desired switching time $T_{sw}$ of the diode 4026, is used along with the selected L, H, and W to calculate a design parameter defined as $$D_{param} = \frac{100 \cdot 2\pi^2 c^2}{T_{sw} \cdot L \cdot W \cdot H}$$

where c represents the speed of light. For $T_{sw}$=5 ps, $D_{param}$=1.4212×10$^{48}$ m$^{-1}$ s$^{-3}$ for th 4026 shown in FIG. 19.

Similarly, a material parameter $M_{param}$ is calculated for various materials as $$M_{param} = \frac{K\omega^2\eta^4}{T_r}$$

where K is the absorption coefficient, ω is the frequency, η is the refractive index, and $T_r$ is the relaxation time of the material. For the diode 4026, K=4612597 m$^{-1}$ at an optical wavelength of λ=0.85 μm in GaSb, ω=2.2176×10$^{15}$ s$^{-1}$, η=4.3287, $T_r$=5 ns, and $M_{param}$=1.5928×10$^{48}$ m$^{-1}$ s$^{-3}$.

When $M_{param}$ and $D_{param}$ are similar in magnitude, the material can be suitable for optical absorption diode 4026 operation. The parameters $M_{param}$ and $D_{param}$ are used as guides to indicate suitable design and material pairings.

Figure 20:
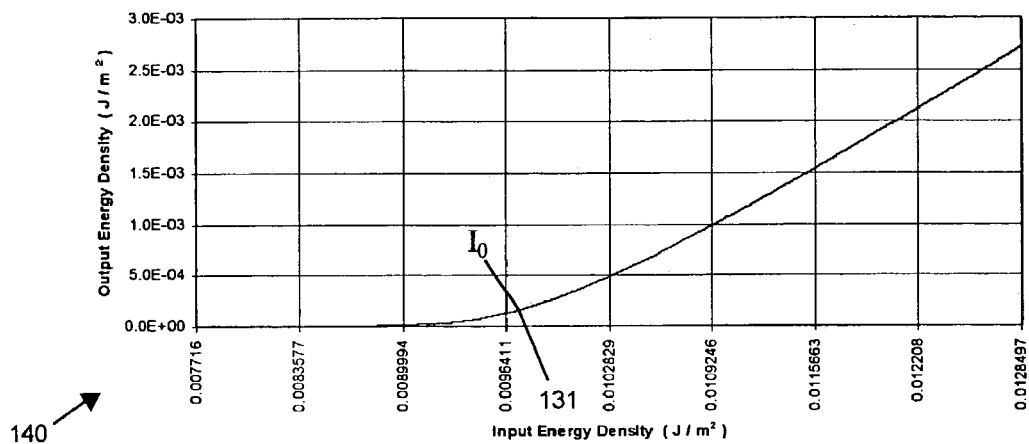
FIG. 20 provides response behavior of various absorption diodes.
Figure 20:
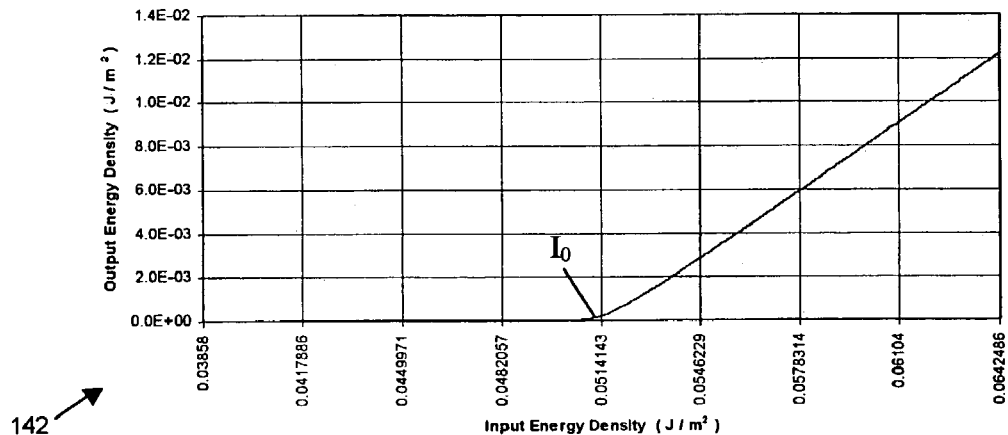
Figure 20:
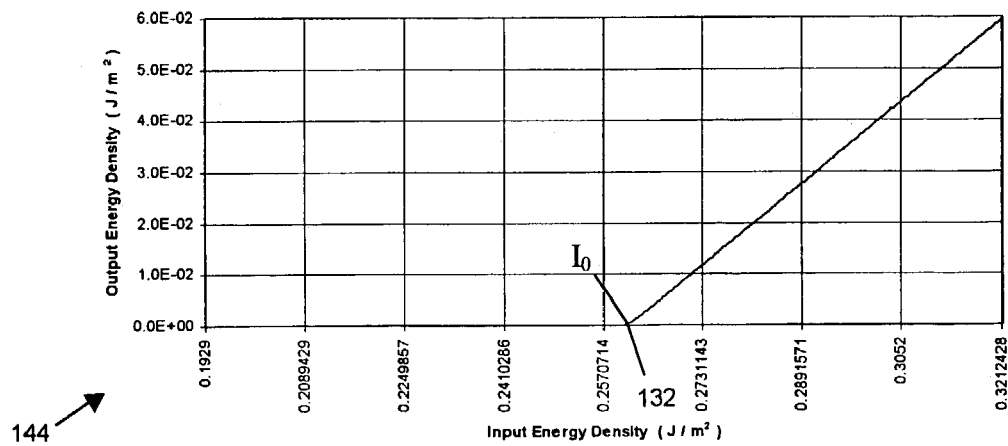

Referring to FIG. 20, the threshold value $I_0$ becomes more distinct as the length of the optical absorption diode 4026 is increased. An optical absorption diode response 140 for L=10 μm, a response 142 for L=50 μm, and a response 144 for L=250 μm are shown in FIG. 20. Each response is shown over a range of 25% greater than and 25% less than the threshold value $I_0$. The preferred operating range of the absorption diode is from the threshold value $I_0$ to 200% greater than (i.e. 3X or 3Y) the threshold value $I_0$. A longer optical absorption diode has a relatively sharper threshold value $I_0$, as indicated by 132 on curve 144. However, the longer optical absorption diode response 144 also has a much larger threshold value $I_0$. A shorter absorption diode has a much smaller threshold value $I_0$, as indicated by 131 on curve 140. However, the threshold value $I_0$ on curve 140 is gradual and not very distinct. A compromise between the two extremes is desirable, as shown by response 142. The threshold value $I_0$ of the optical absorption diode 4026 in FIG. 15 is $I_0$=0.51441 J/m$^2$.

The DPLG 405 of FIG. 15 employs an optical amplifier 134 and a directional coupler 138 as the SSB 98, shown in FIG. 13, to provide two identical data outputs 135, 137. The output beam 4032 is directed into the optical amplifier 134 and the output of the optical amplifier 134 is subsequently directed into the directional coupler 138, functioning as a splitter, thereby producing the two data outputs 135, 137. A semiconductor laser amplifier is commonly used to provide amplification gains of over 100. Single pass amplifiers are preferred in the DPLG 405 because the amplifiers are not phase dependent, do not have a time delay, and are effective for amplifying continuous waveform inputs. Semiconductor laser amplifiers are typically made of materials such as AlGaAs or InGaAsP.

The DPLG 405 of the design example is capable of operating at high speeds as compared to traditional electronic semiconductor devices. The time required for the inputs 4012, 4014 to traverse each component in the DPLG 405 is calculated as $$\frac{\eta \cdot L}{c} = \text{transmission time}$$

where $\eta$ is the refractive index of each component, L is the distance the light travels in the component, and c is the speed of light in a vacuum. For example, the transmission time of the directional coupler 4016 is 1.75428 ps and the total transmission time of the DPLG 405 is 20.25 ps, which represents a switching rate of 49.38 GHz. It is recognized that smaller dimensioned components and refractive indices would result in a decrease in transmission time and an associated increase in switching rate. The DPLG 405 is a low power device that has an input power of approximately 86.9 µW, generates 32.2 µW, and consumes 54.7 µW.

For the design example DPLG 405, several effects have been excluded for the sake of clarity. Thermal effects for the optical absorption diode 4026 are deemed controllable. Although uniform planar waveforms are referred to in FIG. 2, most laser beams are Gaussian and the components of the DPLG 405 as described may require fine tuning. Non-linear refractive index changes are assumed negligible due to the relatively low irradiances and small distances involved. Optical breakdown is not considered significant due to the relatively low irradiances used. Light beam decay in waveguides is small and can be compensated through the use of optical amplifiers 134. Waveguide cladding can be employed to prevent the inclusion of extraneous radiation. The phenomena of reflection has been deemed negligible since it can be controlled with material coatings and refractive index matching.

Although the invention has been described with reference to certain specific embodiments, various modifications thereof will be apparent to those skilled in the art without departing from the spirit and scope of the invention as outlined in the claims appended hereto.

The embodiments of the invention in which an exclusive property or privilege is claimed are defined as follows:

1. A programmable logic device for use with input signals having a periodic waveform of substantially fixed frequency, said device providing a logical output from said input signals and comprising:

(a) at least two inputs each for receiving an optical data signal having one of a predetermined set of values, wherein at least two of said inputs are phase modulated;
    (b) an additional input for receiving an additional optical signal;
    (c) a combiner stage for combining the data signals into a combined signal having one of a plurality of magnitude states and further photonically combining said combined signal with said additional signal to produce an intermediate signal therefrom, the photonic combination of said combined signal with said additional signal performing a phase operation to modify the magnitude of the intermediate signal;
    (d) a filter stage for receiving said intermediate signal and to perform a magnitude operation to modify the magnitude of the intermediate signal to map said intermediate signal to a corresponding one of a set of conditional states to produce a conditioned signal; and
    (e) an output stage for passing said conditioned signal to an output.

2. The programmable logic device according to claim 1, wherein the intermediate signal is adaptable to have a non-zero magnitude for providing a threshold filtering operation of the filter stage.

3. The programmable logic device according to claim 2, wherein said conditioned signal at said output is one of said predetermined set of values.

4. A programmable logic device according to claim 3, wherein said predetermined set of values is selected from a group consisting of analog, digital, discrete, and negligible values.

5. The programmable logic device according to claim 2 wherein the additional signal is combined with any of said signals to produce an output signal that is one of said predetermined set of values.

6. A programmable logic device according to claim 5, wherein a further additional signal is combined with said conditioned signal in said output stage.

7. A programmable logic device according to claim 5, wherein said additional signal is varied for providing a predetermined logic function of said device.

8. A programmable logic device according to claim 2 wherein the additional signal is a first control signal.

9. A programmable logic device according to claim 8 further comprising a second control signal combined with said combined signal in said output stage.

10. A programmable logic device according to claim 9, wherein said second control signal is varied for providing a predetermined logic function of said device.

11. A programmable logic device according to claim 8, wherein said first control signal is varied for providing a predetermined logic function of said device.

12. A programmable logic device according to claim 2, wherein said periodic waveform is substantially coherent.

13. A programmable logic device according to claim 12, wherein a form of said periodic waveform is selected from the group consisting of continuous waves, semi-continuous waves, connected pulses, and connected pulse groups.

14. A programmable logic device according to claim 1, wherein said filter stage includes an absorption diode.

15. A programmable logic device according to claim 1, wherein said filter stage includes a magnitude limiter.

16. A programmable logic device according to claim 1, wherein said periodic waveform is an electromagnetic wave.

17. A programmable logic device according to claim 16, wherein a form of said periodic waveform is selected from the group consisting of continuous waves, semi-continuous waves, connected pulses, and connected pulse groups.

18. A programmable logic device according to claim 1, wherein at least two of said data signals are of substantially the same phase.

19. A programmable logic device according to claim 1, wherein at least two of said data signals are substantially of opposite phases.

20. A programmable logic-device according to claim 1, wherein said predetermined set of values is selected from the group consisting of analog, digital, discrete, and negligible values.

21. A programmable logic device according to claim 1, wherein said additional signal is varied for providing a predetermined logic function of said device.

22. A method for providing a programmable logical output signal for use with input signals having a periodic waveform of substantially fixed frequency including the steps of:
(a) receiving a plurality of data optical signals as inputs, each of said data signals having one of a predetermined set of values, at least two of said data signals being phase modulated;
(b) receiving an additional optical signal;
(c) combining said plurality of data signals into a combined signal having one of a plurality of magnitude states, and further photonically combining said combined signal with said additional signal for producing an intenTlediate signal therefrom, the photonic combination of said combined signal with said additional signal performing. a phase operation to modify the magnitude of the intermediate signal;
(d) mapping said intermediate signal to a corresponding one of a set of conditioned states by performing a magnitude operation to modify the magnitude of the intermediate signal to produce a conditioned signal; and
(e) passing said conditioned signal to an output.

23. A method according to claim 22, wherein the intermediate signal is adaptable to have a non-zero magnitude for providing a threshold filtering operation of the filter storage.

24. A method according to claim 23, wherein said conditioned signal at said output is one of said predetermined set of values.

25. A method according to claim 24, wherein said predetermined set of values is selected from a group consisting of analog, digital, discrete and negligible values.

26. A method according to claim 23 wherein the step of combining said additional signal with said combined data signal provides for an output signal that is one of said predetermined set of values.

27. A method according to claim 26, wherein a further additional signal is combined with said conditioned signal in said output.

28. A method according to claim 26 further comprising the step of varying said additional signal to provide a predetermined logic function of said output signal.

29. A method according to claim 26, wherein said predetermined set of values is selected from a group consisting of analog, digital, discrete, and negligible values.

30. A method according to claim 23 further comprising the step of combining a first control signal with said data signals to determine said intermediate signal.

31. A method according to claim 30 further comprising the step of combining a second control signal with said conditioned signal in said output stage.

32. A method according to claim 31, wherein said data signals include an intermediate signal in said mapping step.

33. A method according to claim 31, wherein said data signals include said conditioned signal in the output step.

34. A method according to claim 31 further comprising the step of varying said second control signal to provide a predetermined logic function of said output signal.

35. A method according to claim 30 further comprising the step of varying said first control signal to provide a predetermined logic function of said output signal.

36. A method according to claim 23, wherein said periodic waveform is substantially coherent.

37. A method according to claim 36, wherein a form of said periodic waveform is selected from the group consisting of continuous waves, semi-continuous waves, connected pulses, and connected pulse groups.

38. A method according to claim 22, wherein said periodic waveform is an electromagnetic wave.

39. A method according to claim 38, wherein a form of said periodic waveforms is selected from the group consisting of continuous waves, semi-continuous waves, connected pulses, and connected pulse groups.

40. A method according to claim 22, wherein at least two of said data signals are of substantially the same phase.

41. A method according to claim 22, wherein at least two of said data signals are substantially of opposite phases.

42. A method according to claim 22, wherein mapping of said intermediate signal employs an absorption diode.

43. A method according to claim 22, wherein mapping of said intermediate signal employs a magnitude limiter.

44. A method according to claim 22, wherein said predetermined set of values is selected from a group consisting of analog, digital, discrete, and negligible values.

45. A programmable logic device for use with data signals comprising optical beams of substantially fixed frequency, said device providing a logical output from at least one of said data signals and comprising:
(a) a pair of inputs and a control input each to receive an optical data signal having one of a predetermined set of values;
(b) a first combiner stage to photonically combine said data signals by performing a phase operation to modify the magnitude of the data signals received from the pair of inputs for producing an intermediate signal therefrom;
(c) a filter stage to receive said intermediate signal and map said intermediate signal by performing a magnitude operation to modify the magnitude of the intermediate signal to produce a conditioned signal having one of a pair of binary states;
(d) a second combiner stage to combine a second control input with said conditioned signal to produce an output signal having one of a predetermined set of values; and
(e) an output stage for passing said output signal to an output.

46. A programmable logic device according to claim 45, wherein intermediate signal is adapted to have a non-zero magnitude for providing a threshold filtering operation of the filter stage.

47. A programmable logic device according to claim 45, wherein said predetermined set of values represents digital states.

48. A programmable logic device according to claim 45, wherein said data signal at said control input is varied for providing a predetermined logic function of said device.

49. A programmable logic device according to claim 45, wherein said second control signal is varied for providing a predetermined logic function of said device.

50. A programmable logic device according to claim 45, wherein said optical beams are substantially coherent.

51. A programmable logic device according to claim 45, wherein at least two data signals are of substantially the same phase.

52. A programmable logic device according to claim 45, wherein at least two of said data signals are substantially of opposite phases.

53. A programmable logic device according to claim 45, wherein a form of said optical beam is selected from a group consisting of continuous waves, semi-continuous waves, connected pulses, and connected pulse groups.

54. A programmable logic device according to claim 45, wherein said filter stage includes an absorption diode.

55. A programmable logic device according to claim 45, wherein said filter stage includes a magnitude limiter.

56. A programmable logic device for use with input signals having a periodic waveform of substantially fixed frequency, said device providing a logical output from said input signals, said device comprising:
 (a) at least two inputs each for receiving an optical data signal having one of a predetermined set of values;
 (b) a first combiner stage for photonically combining the data signals to produce an intermediate signal therefrom, said intermediate signal adaptable to have a non-zero magnitude;
 (c) a filter stage for receiving said intermediate signal, performing a magnitude operation, and providing a threshold filtering operation, to modify the magnitude of the intermediate signal to map said intermediate signal to a corresponding one of a set of conditional states to produce a conditioned signal, the conditioned signal having one of a plurality of magnitude states;
 (d) an additional input for receiving an additional signal, the additional signal being photonically combined with the conditioned signal in a phase operation to modify the magnitude of the conditioned signal to produce an output signal; and
 (e) an output stage for passing the output signal to an output.

57. A programmable logic device according to claim 56, wherein said conditioned signal at said output is one of said predetermined set of values.

58. A programmable logic device according to claim 56, wherein said filter stage includes an absorption diode.

59. A programmable logic device according to claim 56, wherein said filter stage includes a magnitude limiter.

60. A programmable logic device according to claim 56, wherein said additional input is varied for providing a predetermined logic function of said device.

* * * * *